United States Patent
Mustapha

(10) Patent No.: US 11,530,600 B2
(45) Date of Patent: Dec. 20, 2022

(54) FRACTURED RESERVOIR SIMULATION

(71) Applicant: Schlumberger Technology Corporation, Sugar Land, TX (US)

(72) Inventor: Hussein Mustapha, Didcot (GB)

(73) Assignee: Schlumberger Technology Corporation, Sugar Land, TX (US)

( * ) Notice: Subject to any disclaimer, the term of this patent is extended or adjusted under 35 U.S.C. 154(b) by 359 days.

(21) Appl. No.: 16/610,877

(22) PCT Filed: May 2, 2018

(86) PCT No.: PCT/US2018/030598
§ 371 (c)(1),
(2) Date: Nov. 4, 2019

(87) PCT Pub. No.: WO2018/204463
PCT Pub. Date: Nov. 8, 2018

(65) Prior Publication Data
US 2021/0148207 A1    May 20, 2021

Related U.S. Application Data

(60) Provisional application No. 62/501,061, filed on May 3, 2017.

(51) Int. Cl.
*E21B 43/26* (2006.01)
*G06F 30/28* (2020.01)

(52) U.S. Cl.
CPC ........... *E21B 43/26* (2013.01); *G06F 30/28* (2020.01); *E21B 2200/20* (2020.05)

(58) Field of Classification Search
CPC ...... E21B 43/26; E21B 2200/20; E21B 43/00; E21B 41/0092; G06F 30/28; G01V 99/005
USPC .......................................................... 703/10
See application file for complete search history.

(56) References Cited

U.S. PATENT DOCUMENTS

| | | | | |
|---|---|---|---|---|
| 4,031,959 A | * | 6/1977 | Henderson | E21B 43/26 166/278 |
| 7,047,165 B2 | * | 5/2006 | Balaven | G06T 17/20 703/2 |
| 8,301,427 B2 | * | 10/2012 | Souche | E21B 43/26 703/2 |

(Continued)

OTHER PUBLICATIONS

A.T. Watson, "Sensitivity Analysis of Two-Phase Reservoir History matching", Aug. 1989, SPE Res Eng 4(03): 319-324 (Year: 1989).*

(Continued)

*Primary Examiner* — Iftekhar A Khan

(57) ABSTRACT

Simulating fluid flow in a fractured reservoir includes generating a grid for a fractured reservoir model that includes a fracture and a matrix to obtain a generated grid. Cross-flow equilibrium elements are generated based on the generated grid. A volume expansion parameter is selected for the cross flow equilibrium elements, and used, along with physical properties, pore volume and transmissibility multipliers. The physical properties are included in the cross flow equilibrium elements. A fluid flow in the fractured reservoir model is simulated using the pore volume and transmissibility multipliers and a fracture relative permeability curve to obtain a result, which is presented. The fluid flow is calculated for the cross flow equilibrium elements.

20 Claims, 17 Drawing Sheets

(56) References Cited

U.S. PATENT DOCUMENTS

| | | | | |
|---|---|---|---|---|
| 8,386,225 | B2* | 2/2013 | Bourbiaux | E21B 43/26 703/2 |
| 8,521,494 | B2* | 8/2013 | Narr | G06F 30/23 702/6 |
| 9,026,416 | B2* | 5/2015 | Mallison | G06F 30/23 703/10 |
| 9,176,246 | B2* | 11/2015 | Ma | G01V 1/301 |
| 9,361,414 | B2 | 6/2016 | Mustapha | |
| 10,572,611 | B2* | 2/2020 | Huang | G06F 30/20 |
| 10,641,923 | B2* | 5/2020 | Jerbi | G01V 3/38 |
| 10,914,140 | B2* | 2/2021 | Sepehrnoori | E21B 41/0092 |
| 11,073,006 | B2* | 7/2021 | Hoeink | E21B 43/26 |
| 11,294,095 | B2* | 4/2022 | Mustapha | G01V 99/005 |
| 11,320,555 | B2* | 5/2022 | Miao | G01V 1/306 |
| 11,371,333 | B2* | 6/2022 | Mustapha | G06F 30/20 |
| 2003/0216898 | A1* | 11/2003 | Basquet | E21B 49/00 703/10 |
| 2005/0273303 | A1* | 12/2005 | Flandrin | G06T 17/20 703/10 |
| 2006/0015310 | A1* | 1/2006 | Husen | E21B 43/26 703/10 |
| 2007/0073527 | A1* | 3/2007 | Flandrin | G06T 17/20 703/10 |
| 2008/0133186 | A1* | 6/2008 | Li | G06F 30/23 703/2 |
| 2010/0138196 | A1* | 6/2010 | Hui | E21B 43/00 703/1 |
| 2010/0250216 | A1* | 9/2010 | Narr | E21B 49/00 703/10 |
| 2012/0158380 | A1* | 6/2012 | Hajibeygi | E21B 43/26 703/2 |
| 2012/0179436 | A1* | 7/2012 | Fung | G01V 99/00 703/2 |
| 2013/0124178 | A1* | 5/2013 | Bowen | E21B 43/26 703/10 |
| 2014/0046636 | A1* | 2/2014 | Mustapha | E21B 43/26 703/2 |
| 2014/0163939 | A1* | 6/2014 | Bourbiaux | E21B 43/26 703/2 |
| 2017/0321548 | A1* | 11/2017 | Enkababian | E21B 49/086 |
| 2018/0016890 | A1* | 1/2018 | Friehauf | E21B 47/135 |
| 2018/0371874 | A1* | 12/2018 | Shetty | E21B 47/06 |
| 2019/0025460 | A1* | 1/2019 | Mustapha | G06F 30/20 |
| 2019/0186255 | A1* | 6/2019 | Mustapha | E21B 47/09 |

OTHER PUBLICATIONS

T.H. Sadve, I. Berre, J.M. Nordbotten: "An efficient multi-point flux approximation method for Discrete Fracture-Matrix simulations", Journal of Computational Physics, Jan. 28, 2012, Journal of Computational Physics 231 (2012) 3784-3800 (Year: 2012).*

Bahrainian et al. (Unstructured Grid Generation in Porous Domains for Flow Simulations with Discrete-Fracture Network Model, Transp Porous Med (2015) 109:693-709) (Year: 2015).*

Sahimi et al. (Upscaled Unstructured Computational Grid for Efficient Simulation of Flow in Fractured Porous Media, Transp Porous Med (2010) 83:195-218) (Year: 2010).*

Hoteit et al. (Multicomponent fluid flow by discontinuous Galerkin and mixed methods in unfractured and fractured media, American Geophysical Union, 2005, pp. 1-15) (Year: 2005).*

International Preliminary Report on Patentability for the International patent application PCT/US2018/030598 dated Nov. 14, 2019.

Karimi-Fard et al., "An efficient discrete-fracture model applicable for general-purpose reservoir simulators," SPE Journal, Jun. 2004, vol. 9, Issue 02, pp. 227-236.

Moortgat, et al., "Higher-order compositional modeling of three-phase flow in 3D fractured porous media based on cross-?ow equilibrium," Journal of Computational Physics, 250 (2013), pp. 425-445.

Mustapha, "An efficient hybrid local nonmatching method for multiphase flow simulations in heterogeneous fractured media," Engineering with Computers, vol. 31 Issue 2, Apr. 2015, pp. 347-360.

Mustapha, "Multiphase flow simulations in heterogeneous fractured media through hybrid grid method," AIP Conference Proceedings, Jan. 1, 2013, pp. 2048-2054.

Zidane, et al., "An efficient numerical model for multicomponent compressible flow in fractured porous media," Advances in Water Resources, vol. 74, Dec. 1, 2014, pp. 127-147.

Zidane, et al., "Fracture-Cross-Flow Equilibrium in Compositional Two-Phase Reservoir Simulation," SPE Journal, vol. 22, No. 3, Jun. 1, 2017, pp. 950-970.

International Search Report and Written Opinion for the International patent application PCT/US2018/030598 dated Aug. 10, 2018.

* cited by examiner

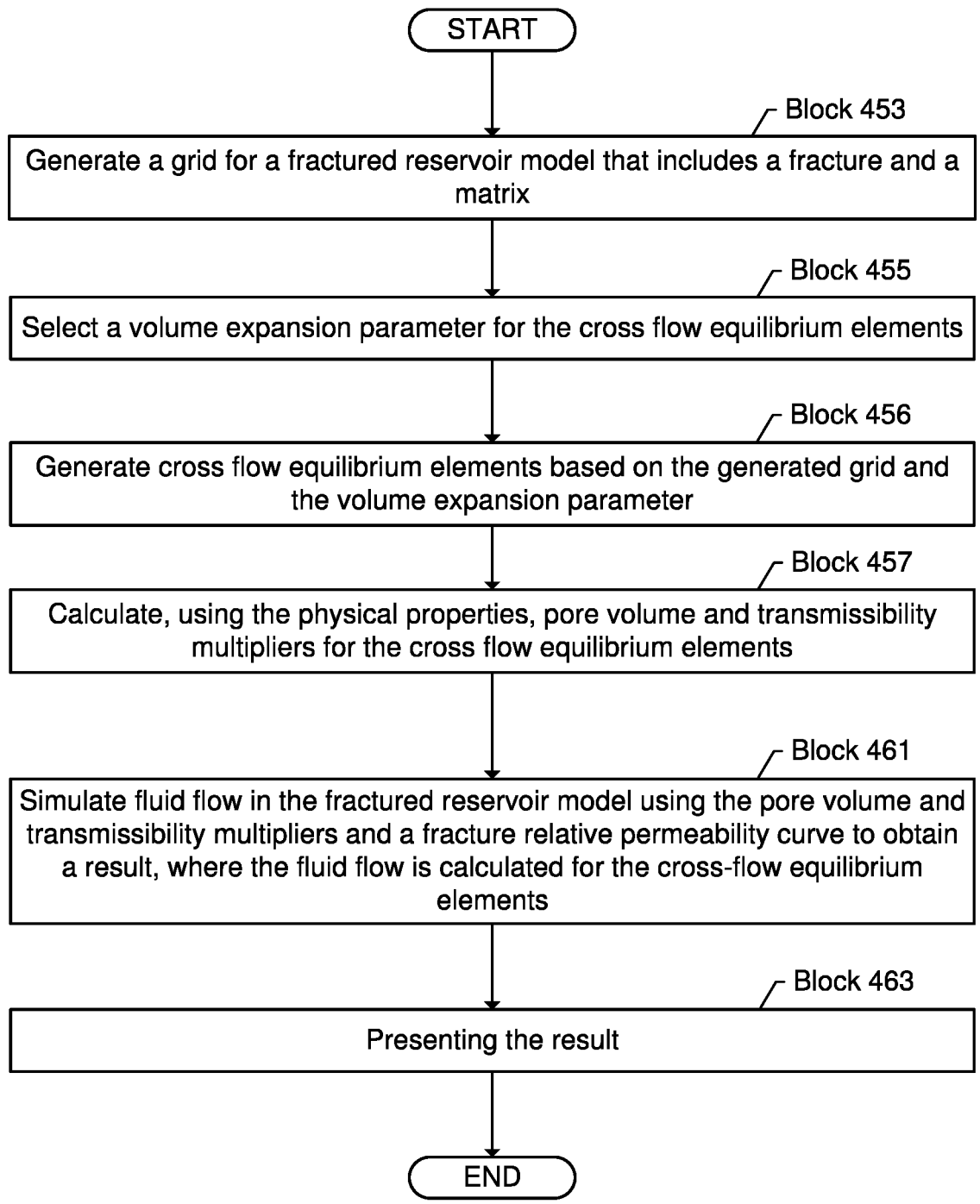
FIG. 4.1

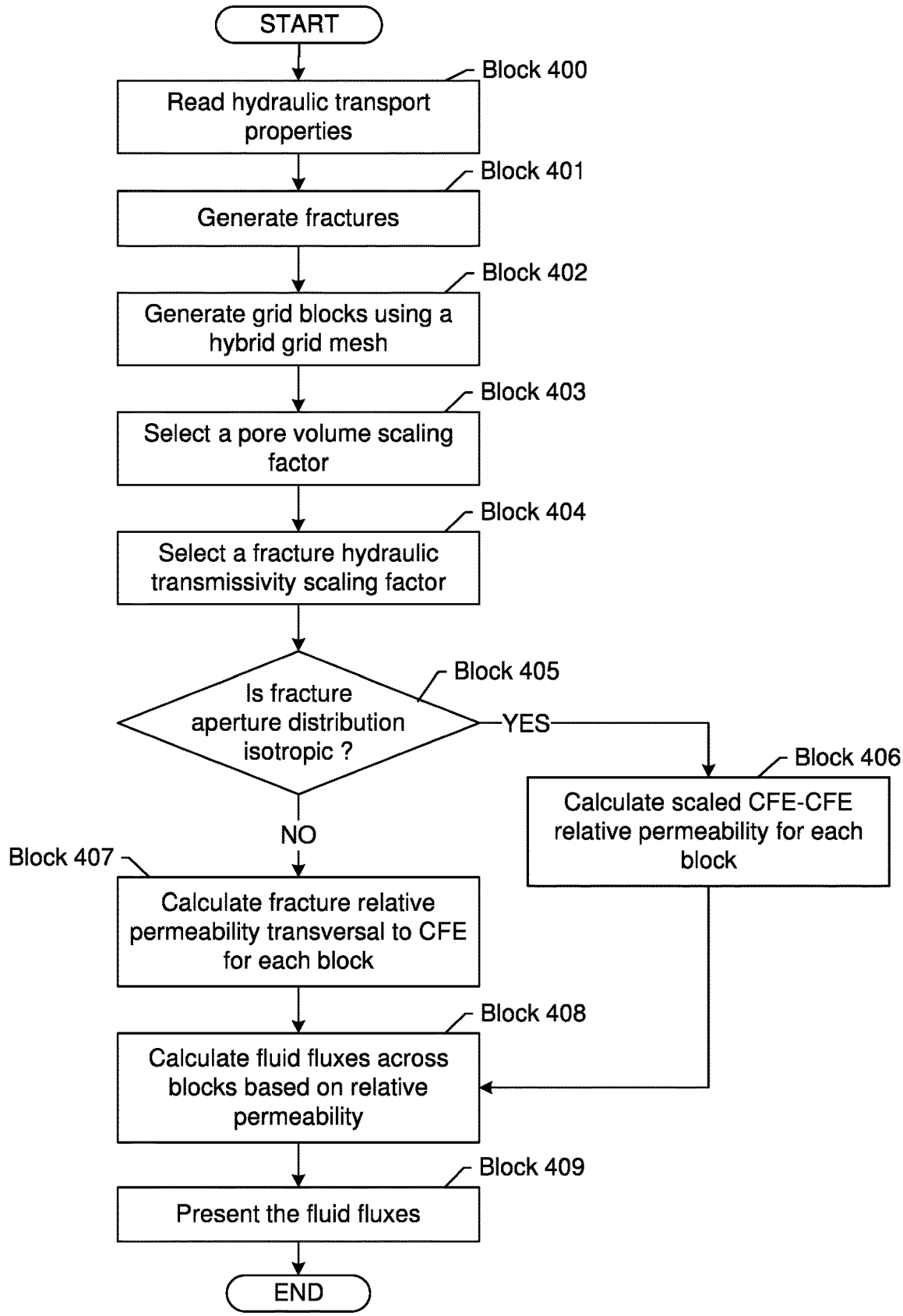
FIG. 4.2

Single Porosity (SP)
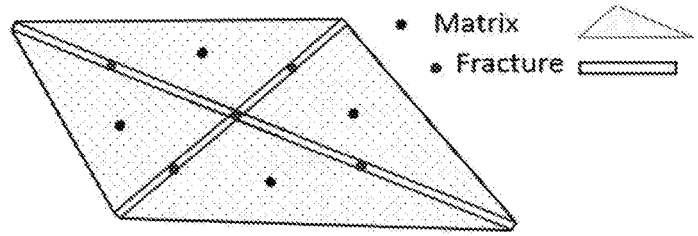
FIG. 6.1
(a) Hybrid Grid (HG) (Grid Space)
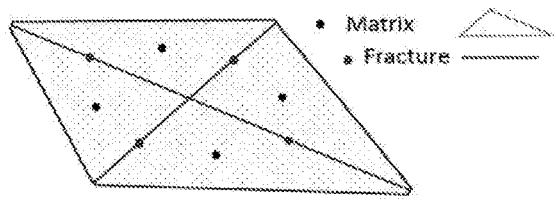
(b) Hybrid Grid (HG) (Computational Space)
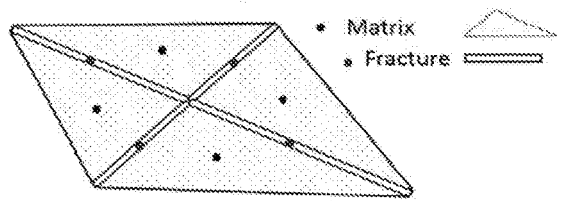
FIG. 6.2
(a) Single Porosity (SP)
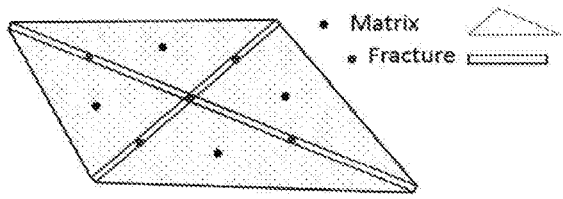
(b) Cross-Flow Equilibrium (CFE)
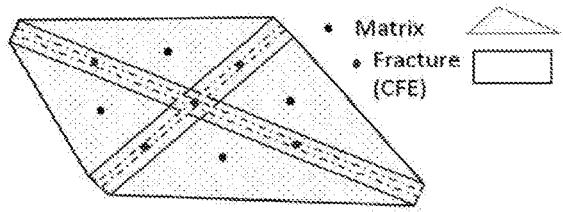
FIG. 6.3
(a) HG-CFE Method (Grid Space)
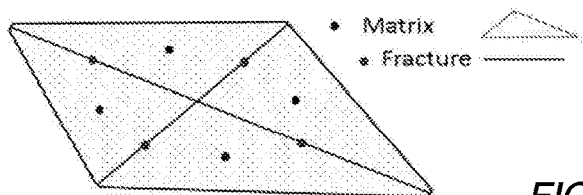
(b) HG-CFE Method (Computational Space)
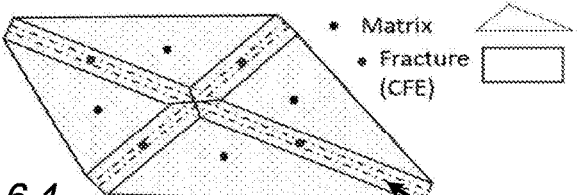
FIG. 6.4

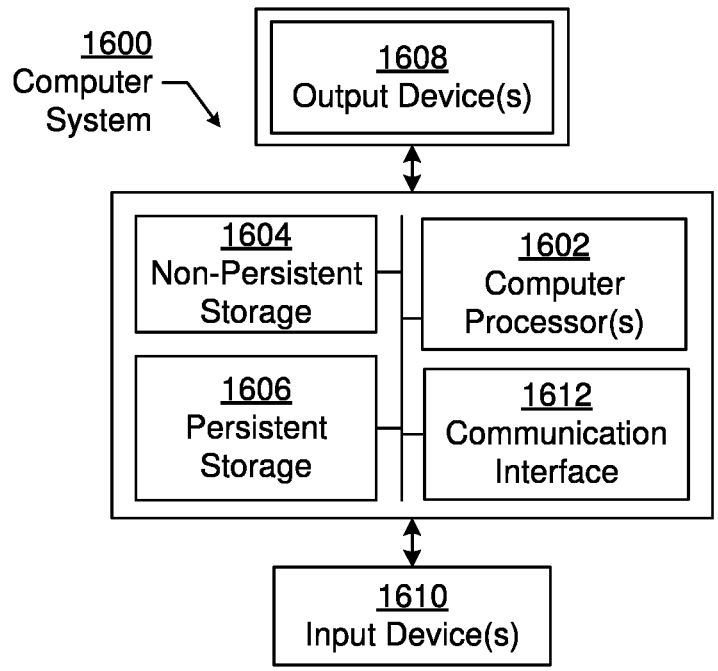
FIG. 16.1
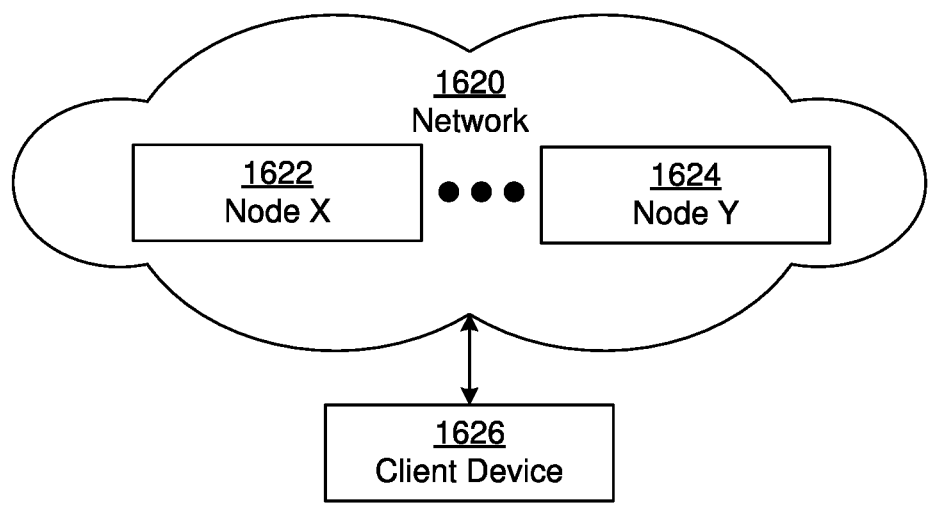
FIG. 16.2

FRACTURED RESERVOIR SIMULATION

CROSS REFERENCE TO RELATED APPLICATIONS

The referenced application claims benefit of U.S. Patent Application Ser. No. 62/501,061 filed on May 3, 2017. U.S. Patent Application Ser. No. 62/501,061 is incorporated herein by reference in its entirety.

BACKGROUND

Computer systems are used for a variety of technological fields in order to model various aspects of a technology. For example, one use of computer systems is to model underground formations and model the extraction of hydrocarbons. Specifically, sensors at the oilfield gather large volumes of data. The sensors send the large volumes of data to the computer system. Through the various techniques of mathematical modeling and simulations, the computer system attempts to create an optimal design for extracting hydrocarbons. A challenge exists to manage the amount of data that the computer system receives, the execution times, and the various timing requirements for returning a result. Often, the computer system is inefficient or inaccurate when performing the modeling and generating a result. Inefficiency causes delay or more computing resources to be used and inaccuracy causes the resulting design to be non-optimal.

SUMMARY

In general, one or more embodiments is directed to simulating fluid flow in a fractured reservoir. Simulating fluid flow in a fractured reservoir includes generating a grid for a fractured reservoir model that includes a fracture and a matrix to obtain a generated grid. Cross-flow equilibrium elements are generated based on the generated grid. A volume expansion parameter is selected for the cross-flow equilibrium elements, and used, along with physical properties, pore volume and transmissibility multipliers. The physical properties are included in the cross-flow equilibrium elements. A fluid flow in the fractured reservoir model is simulated using the pore volume and transmissibility multipliers and a fracture relative permeability curve to obtain a result, which is presented. The fluid flow is calculated for the cross-flow equilibrium elements.

Other aspects of the invention will be apparent from the following description and the appended claims.

BRIEF DESCRIPTION OF DRAWINGS

FIGS. 4.1 and 4.2 show a flowchart in accordance with one or more embodiments.

FIGS. 5, 6.1, 6.2, 6.3, 6.4, 7, 8.1, 8.2, 9, 10, 11, 12, 13, 14, and 15 show examples in accordance with one or more embodiments.

FIGS. 16.1 and 16.2 show a computing system in accordance with one or more embodiments.

DETAILED DESCRIPTION

Figure 1:
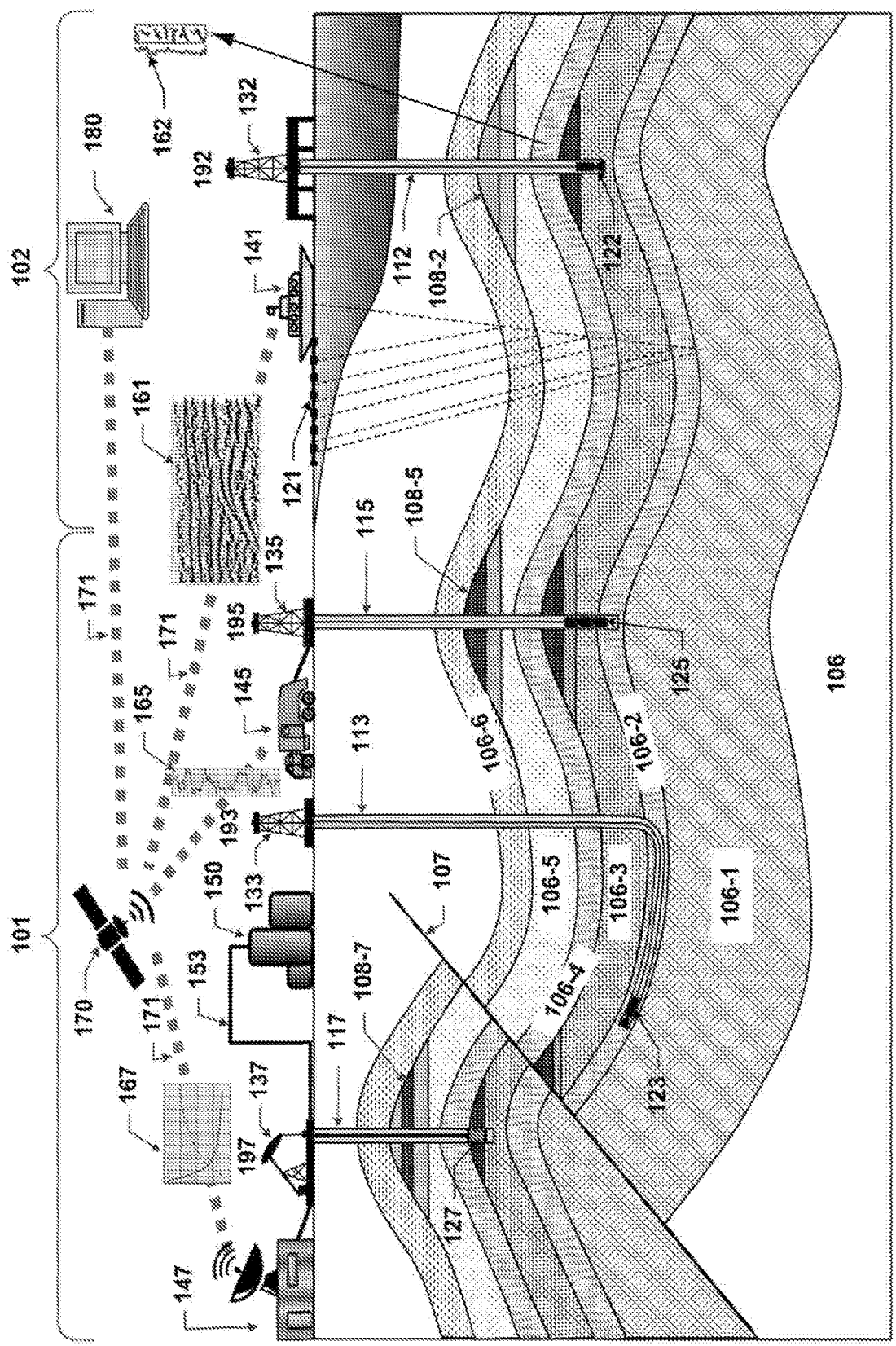
FIG. 1 shows a schematic view, partially in cross section, of hydrocarbon production fields in which one or more embodiments may be implemented.

Specific embodiments will now be described in detail with reference to the accompanying figures. Like elements in the various figures are denoted by like reference numerals for consistency.

In the following detailed description of embodiments, numerous specific details are set forth in order to provide a more thorough understanding. However, it will be apparent to one of ordinary skill in the art that embodiments may be practiced without these specific details. In other instances, well-known features have not been described in detail to avoid unnecessarily complicating the description.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

In general, embodiments are directed to improving accuracy and efficiency of a computer system when simulating fluid flow in a fractured reservoir. One or more embodiments perform numeric simulation of reservoir models. In one or more embodiments, the reservoir may be a tight reservoir. For example, the tight reservoir may be a shale formation that contain hydrocarbon fluids (e.g. oil and gas). One or more embodiments may be applied to reservoir simulation to manage a physical reservoir. Reservoir simulation involves the construction of a computer model to represent a portion of a subsurface formation (e.g., a reservoir) for the purposes of making decisions regarding the development of an oil and gas field.

The tight reservoirs may be difficult to develop as the reservoir formation exhibits very low permeability (e.g., microDarcy or nanoDarcy orders of magnitude) that reduces the flow of hydrocarbon fluids toward the production wells. In one or more embodiments, the tight reservoirs may be artificially fractured in order to create high permeability pathways for the hydrocarbon fluids to reach the production wells. In one or more embodiments, the fracture space creates large difference of rock properties between the fracture and the rock matrix. The large variation of rock properties across fractures complicates the applicability of traditional simulation of hydrocarbon storage and transport in pores.

One or more embodiments may provide a method and system for simulation of fluid transport in fractured reservoirs by analyzing the impact of fracture-matrix fluid mobility on flow behavior using an efficient general purpose field-scale fractured (EGPFSF) reservoir simulation model. In one or more embodiments, the EGPFSF model is obtained by combining hybrid grid model with a cross flow equilibrium (CFE) model. The EBPFSF reservoir simulation model may be referred to as HG-CFE model.

In particular, one or more embodiments are directed to efficiently simulating a reservoir, such as a tight reservoir, on a computer system. Because of the number of calculations performed using single porosity (SP) simulation, SP simulation may be considered inefficient when executing on a computer system, while other reservoir simulation techniques may not be sufficiently accurate. Because of the decrease in execution time through fewer computations, one or more embodiments increases the performance of the computing system while adhering to a desired level of accuracy.

The hybrid grid (HG) model represents fractures as lower-dimensional objects that still are represented as cells in the computational grid. The HG model is equivalent to a SP model with the advantage of providing a solution for the small control volumes at the intersection between fractures. However, the simulation run time is constrained by the internal small fracture cells (i.e., small pore volumes) characterized with high permeability.

In one or more embodiments, the cross-flow equilibrium model includes combining fractures with a fraction of the neighboring matrix blocks on either side of the fractures into larger elements to achieve a better computational efficiency over conventional SP models. The implementation of CFE in the field is dependent on an accurate computational grid associated with the CFE elements. The EGPFSF model improves the CFE model by analyzing the impact of fracture-rock matrix flow interaction. The HG-CFE model, may configured to be implemented on both structured and unstructured meshes.

In one or more embodiments, the HG-CFE model is implemented as a computer model to simulate fluid flow in fracture and rock matrix. The computer model represents the physical space of the reservoir by an array of discrete grid blocks. The physical space is delineated by a grid which may be structured or unstructured. Each block in the grid represents a subsurface volume. The array of grid blocks may be two-dimensional (2D), three-dimensional (3D), etc. Values for physical properties, such as porosity, permeability and water, oil, and gas saturation, may be associated with each grid block. The value of each attribute is implicitly deemed to apply uniformly throughout the volume of the reservoir that is represented by the grid block. As an example, simulations may solve a complex set of non-linear partial differential equations that model the fluid flow in porous media over a sequence of simulation time points. Grid resolution may impact the accuracy of simulation results, such as in unstable displacement processes. In one or more embodiments, upscaling techniques may be used to capture fine scale phenomena while improving the computation time.

FIG. 1 depicts a schematic view, partially in cross section, of an onshore field (101) and an offshore field (102) in which one or more embodiments may be implemented. In one or more embodiments, one or more of the modules and elements shown in FIG. 1 may be omitted, repeated, and/or substituted. Accordingly, embodiments should not be considered limited to the specific arrangement of modules shown in FIG. 1.

As shown in FIG. 1, the fields (101), (102) includes a geologic sedimentary basin (106), wellsite systems (192), (193), (195), (197), wellbores (112), (113), (115), (117), data acquisition tools (121), (123), (125), (127), surface units (141), (145), (147), well rigs (132), (133), (135), production equipment (137), surface storage tanks (150), production pipelines (153), and an exploration and production (E&P) computer system (180) connected to the data acquisition tools (121), (123), (125), (127), through communication links (171) managed by a communication relay (170).

The geologic sedimentary basin (106) contains subterranean formations. As shown in FIG. 1, the subterranean formations may include several geological layers (106-1 through 106-6). As shown, the formation may include a basement layer (106-1), one or more shale layers (106-2, 106-4, 106-6), a limestone layer (106-3), a sandstone layer (106-5), and any other geological layer. A fault plane (107) may extend through the formations. In particular, the geologic sedimentary basin includes rock formations and may include at least one reservoir including fluids, for example the sandstone layer (106-5). In one or more embodiments, the rock formations include at least one seal rock, for example, the shale layer (106-6), which may act as a top seal. In one or more embodiments, the rock formations may include at least one source rock, for example the shale layer (106-4), which may act as a hydrocarbon generation source. The geologic sedimentary basin (106) may further contain hydrocarbon or other fluids accumulations associated with certain features of the subsurface formations. For example, accumulations (108-2), (108-5), and (108-7) associated with structural high areas of the reservoir layer (106-5) and containing gas, oil, water or any combination of these fluids.

In one or more embodiments, data acquisition tools (121), (123), (125), and (127), are positioned at various locations along the field (101) or field (102) for collecting data from the subterranean formations of the geologic sedimentary basin (106), referred to as survey or logging operations. In particular, various data acquisition tools are adapted to measure the formation and detect the physical properties of the rocks, subsurface formations, fluids contained within the rock matrix and the geological structures of the formation. For example, data plots (161), (162), (165), and (167) are depicted along the fields (101) and (102) to demonstrate the data generated by the data acquisition tools. Specifically, the static data plot (161) is a seismic two-way response time. Static data plot (162) is core sample data measured from a core sample of any of subterranean formations (106-1 to 106-6). Static data plot (165) is a logging trace, referred to as a well log. Production decline curve or graph (167) is a dynamic data plot of the fluid flow rate over time. Other data may also be collected, such as historical data, analyst user inputs, economic information, and/or other measurement data and other parameters of interest.

The acquisition of data shown in FIG. 1 may be performed at various stages of planning a well. For example, during early exploration stages, seismic data (161) may be gathered from the surface to identify possible locations of hydrocarbons. The seismic data may be gathered using a seismic source that generates a controlled amount of seismic energy. In other words, the seismic source and corresponding sensors (121) are an example of a data acquisition tool. An example of seismic data acquisition tool is a seismic acquisition vessel (141) that generates and sends seismic waves below the surface of the earth. Sensors (121) and other equipment located at the field may include functionality to detect the resulting raw seismic signal and transmit raw seismic data to a surface unit (141). The resulting raw seismic data may include effects of seismic wave reflecting from the subterranean formations (106-1 to 106-6).

After gathering the seismic data and analyzing the seismic data, additional data acquisition tools may be employed to gather additional data. Data acquisition may be performed at various stages in the process. The data acquisition and corresponding analysis may be used to determine where and how to perform drilling, production, and completion operations to gather downhole hydrocarbons from the field. Generally, survey operations, wellbore operations and production operations are referred to as field operations of the field (101) or (102). These field operations may be performed as directed by the surface units (141), (145), (147). For example, the field operation equipment may be controlled by a field operation control signal that is sent from the surface unit.

Further as shown in FIG. 1, the fields (101) and (102) include one or more wellsite systems (192), (193), (195), and (197). A wellsite system is associated with a rig or a production equipment, a wellbore, and other wellsite equipment configured to perform wellbore operations, such as logging, drilling, fracturing, production, or other applicable operations. For example, the wellsite system (192) is associated with a rig (132), a wellbore (112), and drilling equipment to perform drilling operation (122). In one or more embodiments, a wellsite system may be connected to a production equipment. For example, the well system (197) is connected to the surface storage tank (150) through the fluids transport pipeline (153).

In one or more embodiments, the surface units (141), (145), and (147), are operatively coupled to the data acquisition tools (121), (123), (125), (127), and/or the wellsite systems (192), (193), (195), and (197). In particular, the surface unit is configured to send commands to the data acquisition tools and/or the wellsite systems and to receive data therefrom. In one or more embodiments, the surface units may be located at the wellsite system and/or remote locations. The surface units may be provided with computer facilities (e.g., an E&P computer system) for receiving, storing, processing, and/or analyzing data from the data acquisition tools, the wellsite systems, and/or other parts of the field (101) or (102). The surface unit may also be provided with or have functionally for actuating mechanisms of the wellsite system components. The surface unit may then send command signals to the wellsite system components in response to data received, stored, processed, and/or analyzed, for example, to control and/or optimize various field operations described above.

In one or more embodiments, the surface units (141), (145), and (147) are communicatively coupled to the E&P computer system (180) via the communication links (171). In one or more embodiments, the communication between the surface units and the E&P computer system may be managed through a communication relay (170). For example, a satellite, tower antenna or any other type of communication relay may be used to gather data from multiple surface units and transfer the data to a remote E&P computer system for further analysis. Generally, the E&P computer system is configured to analyze, model, control, optimize, or perform management tasks of the aforementioned field operations based on the data provided from the surface unit. In one or more embodiments, the E&P computer system (180) is provided with functionality for manipulating and analyzing the data, such as analyzing seismic data to determine locations of hydrocarbons in the geologic sedimentary basin (106) or performing simulation, planning, and optimization of exploration and production operations of the wellsite system. In one or more embodiments, the results generated by the E&P computer system may be displayed for user to view the results in a two-dimensional (2D) display, three-dimensional (3D) display, or other suitable displays. Although the surface units are shown as separate from the E&P computer system in FIG. 1, in other examples, the surface unit and the E&P computer system may also be combined. The E&P computer system and/or surface unit may correspond to a computing system, such as the computing system shown in FIGS. 15.1 and 15.2 and described below.

Figure 2:
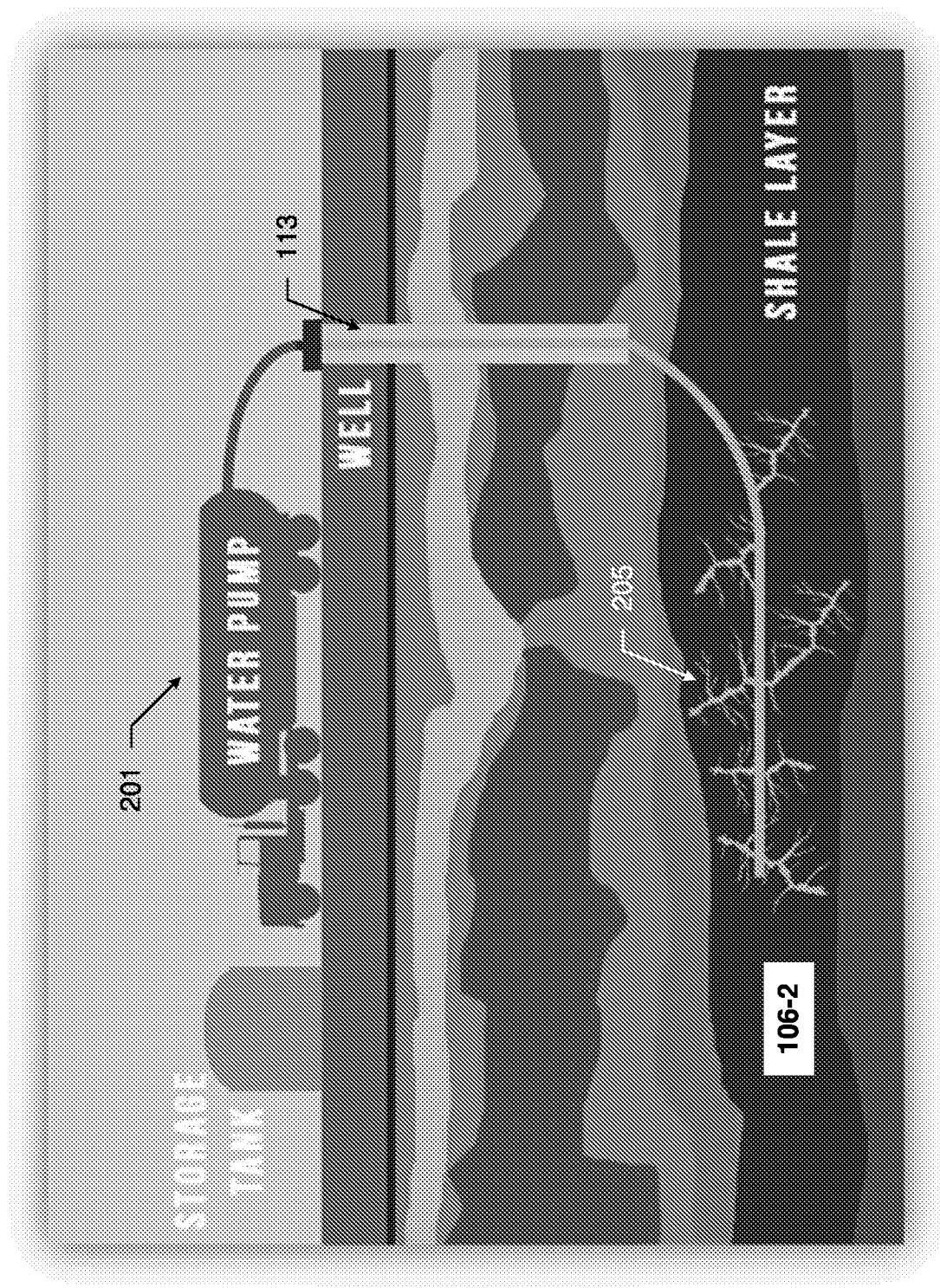
FIG. 2 shows a well system where a fracking operation is executed.

FIG. 2 depicts a fracking operation performed on a subsurface formation at the location of a well system. For example, the well system may be the well system (193) as presented in FIG. 1. In one or more embodiments the fracking operation includes injecting high pressure water into a low permeability subsurface formation in order to generate a fracture network (205) within the subsurface formation. For example, the subsurface formation may be a shale layer (106-2). In one or more embodiments, the high pressure injection is executed by a mobile water pump (201) injecting the water through a wellbore (113) of a horizontally drilled well. In one or more embodiments, the fracture network (205) enhance the flow of hydrocarbon fluids from the rock matrix into the wellbore. Other technologies for generating fracture networks may be used without departing from the scope of the claims.

Figure 3:
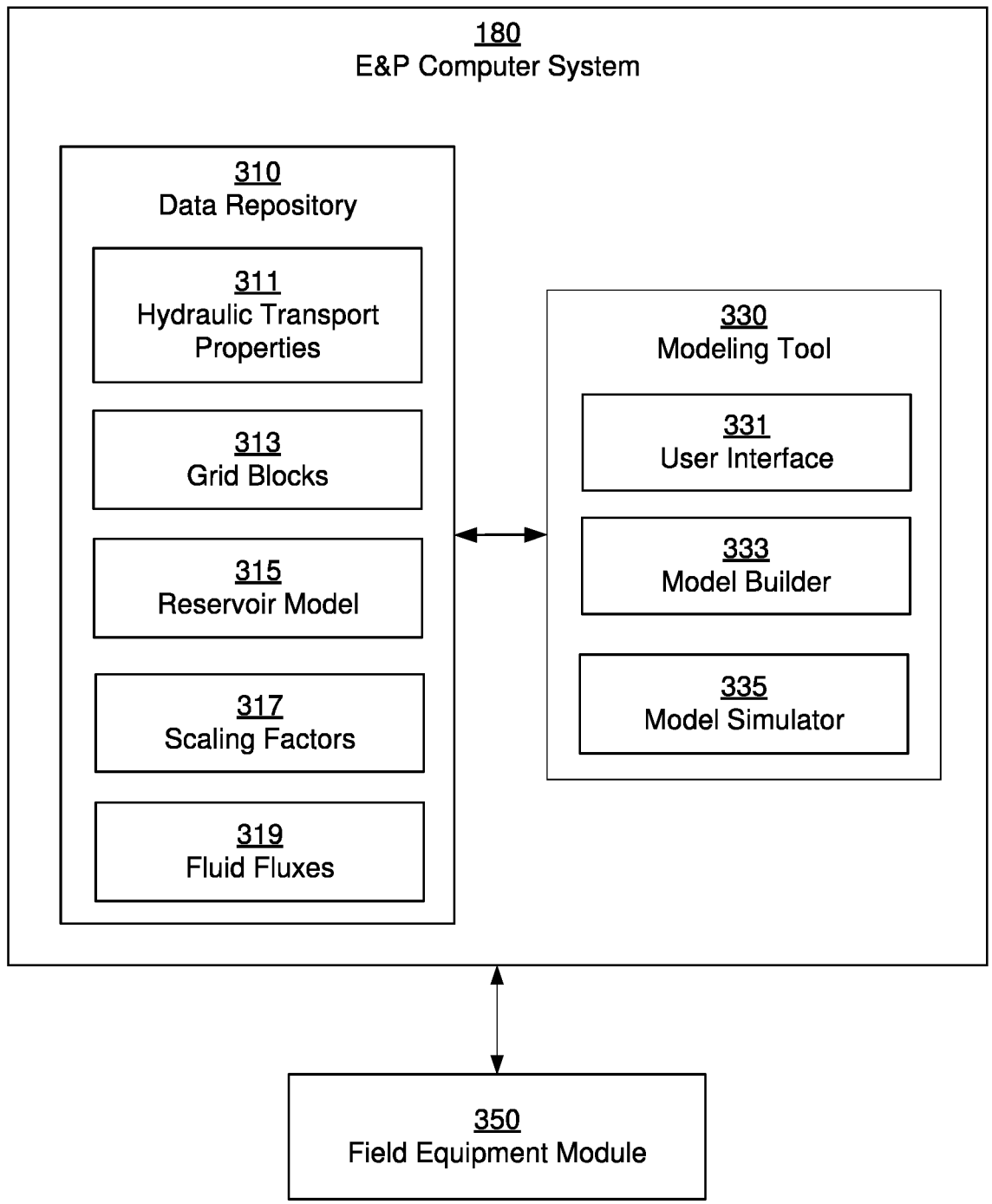
FIG. 3 shows a diagram of a system in accordance with one or more embodiments.

FIG. 3 shows more details of the E&P computer system (180) in which one or more embodiments of the technology may be implemented. In one or more embodiments, one or more of the modules and elements shown in FIG. 3 may be omitted, repeated, and/or substituted. Accordingly, embodiments of the efficient general purpose field-scale fractured reservoir simulation model should not be considered limited to the specific arrangements of modules shown in FIG. 3.

As shown in FIG. 3, the E&P computer system (180) includes a data repository (310) for storing input data, intermediate data, and resultant outputs of the analysis data, a modeling tool (330), and a field equipment module (350) for performing various tasks of the field operation. In one or more embodiments, the data repository (310) may include one or more disk drive storage devices, one or more semiconductor storage devices, other suitable computer data storage devices, or combinations thereof. In one or more embodiments, content stored in the data repository (310) may be stored as a data file, a linked list, a data sequence, a database, a graphical representation, any other suitable data structure, or combinations thereof.

In one or more embodiments, the content stored in the data repository (310) includes hydraulic transport properties (311), grid blocks (313), reservoir model (315), scaling factors (317) and fluid fluxes (319). Each of these components is discussed below.

In one or more embodiments, the hydraulic transport properties (311) describe the physical properties of fluids and rocks of the subsurface formation. In one or more embodiments, the hydraulic transport properties (311) control the flow velocity of hydrocarbon components and phases through the rocks of the subsurface formations. For example, the fluid properties may include density, viscosity, temperature, pressure, chemical composition, and other properties of one or more fluids. Further, the rock properties may include density, porosity, permeability, capillary entry pressure and other properties of one or more rocks. In one or more embodiments, the rocks may be naturally or artificially fractured. The fractures may be characterized by the fault properties (e.g., capillary pressure, shale gauge ratio, etc.) associated with the subsurface formations.

In one or more embodiments, the subsurface reservoir can be represented in a computer model as a grid. A grid is a mathematical construction of a volume of rock representing a fractured reservoir model and the characteristics that form the reservoir. A grid includes grid blocks (313), each grid block corresponding to a subsurface volume of the reservoir. In one or more embodiments, each grid block is characterized by a set of location and dimension properties. In one or more embodiments, the grid block dimension parameters may result from the model resolution parameter. In one or more embodiments, the grid blocks may be structured, or defined by a regular shape. In one or more embodiments, the grid blocks may be unstructured, or defined by an irregular shape. In one or more embodiments, each grid block has assigned a set of hydraulic transport properties (311) that are constant within a single grid block.

The fractured reservoir model (315) is representations of the subsurface domains that includes spatial description of subsurface components and components physical properties. The fractured reservoir model includes (e.g., represents) one or more fractures and one or more matrices. A fracture is any separation in a geologic formation, such as a joint or a fault that divides the rock into two or more pieces. The fracture exists as a separation within the matrix, where the matrix is the rock. Fractures may be naturally occurring through tectonic forces, fluid movement, and chemical dissolution or fractures may be the result of forcing fluids or slurries into underground formations through the process of hydraulic fracturing. In one or more embodiments, the fractured reservoir model is a bifurcated system having a grid space and a computational space.

In the grid space, the fractured reservoir model is a grid having grid blocks (313). Each grid block has associated hydraulic transport properties (311), boundary conditions and other elements used to simulate the reservoir model. The grid blocks represent matrix elements. Fractures are represented in a lower dimension than the grid blocks and are between grid blocks according to the fractured reservoir. For example, if the grid blocks are in three dimensional space, the fractures are in two-dimensional space. By way of another example, if the grid blocks are in two-dimensional space, the fractures are in one-dimensional space between various grid blocks.

In the computational space, the fractured reservoir model has the grid blocks for both the matrix and the fractures, where the matrix and the fractures represented in the same dimension. For example, if the grid blocks are in three dimensional space, the fractures are in three-dimensional space. By way of another example, if the grid blocks are in two-dimensional space, the fractures are in two-dimensional space between various grid blocks. The grid blocks corresponding to the matrix is represented as matrix elements.

In the computational space, the fractured reservoir model includes a set of cross flow equilibrium elements. A cross flow equilibrium element is an expanded fracture that not only includes the actual fracture volume, but also incorporates a portion of the surrounding rock into the fracture volume. Specifically, with a tight reservoir, an accurate model of the fracture represents the fracture as a small volume in between matrix elements, where small is relative to the size of the surrounding matrix elements. Because of the relative size of the fracture as compared to the matrix elements, simulations of fluid fluxes using accurate models take a substantial amount of compute time by a computing system. One or more embodiments artificially expands the size of the fracture to include a portion of the surrounding matrix elements along the length of the fracture. The matrix elements around the fracture are reduced correspondingly in size. The result of using larger cross flow equilibrium elements corresponding to larger control volumes for the fracture. Thus, one or more embodiments achieve a better computational efficiency than conventional fractured reservoir computational grid models.

Continuing with the reservoir model, in one or more embodiments, the fracture to fracture intersection does not include a volume. In other words, the fracture to fracture intersection is not modeled in accordance with one or more embodiments of the invention. Rather, a star delta approach is used to model fluid flow between fractures.

In one or more embodiments, a volume expansion parameter is the amount that the fracture is expanded to include the surrounding matrix elements. The volume expansion parameter may be an absolute value (e.g., a defined value of a minimum size or set size) or a multiplier that defines a value to multiply by the fracture size. Other type of volume expansion parameters may be used without departing from the scope of the claims.

The scaling factors (317) are constant values applied to physical property to obtain an equivalent property that would produce the same results in a simplified calculation as the results of a complex calculation using the physical property. In one or more embodiments, the scaled physical property is proportional with the physical property. The proportionality constant or amount that the scaled physical property is proportional with the physical property is the scaling factor. For example, the hydraulic transmissivity used to predict a set of fluid fluxes may be scaled to be used with a simpler version of fluid flow equation.

The fluid fluxes (319) are defined as fluxes of the fluids crossing the grid block boundaries as resulted from reservoir simulations. A flux is a flow rate per unit area. In one or more embodiments, a set of fluid fluxes are calculated at each time step during a reservoir simulation.

Continuing with FIG. 3, the E&P computer system (180) additionally includes a modeling tool (330) in accordance with one or more embodiments. The modeling tool (330) includes a user interface (331), a model builder (333), and a model simulator (335). Each of these components is described below.

In one or more embodiments, the user interface (331) corresponds to a graphical user interface (GUI) that includes functionality to receive input from a user and present or display graphical data to the user. The user interface (331) may include a 3D subsurface reservoir viewer, a 2D section of subsurface reservoir profile viewer, and parameters value input fields in accordance with one or more embodiments. The input fields include functionality to receive input parameters from a user. For example, the input parameters may include a set of boundary conditions to simulate a model, a gridding option to grid a reservoir model, an observation point angle defining a rendering of the 3D subsurface reservoir, a location to display a 2D section of subsurface reservoir, a color palette to map different hydraulic transport properties, or any other parameter for simulating the reservoir. In one or more embodiments, the input fields may include selection boxes, text fields, drop-down menus, or any other type of field for a user to input data.

The model builder (333) is a software tool configured to build a reservoir model (315) defined by the grid blocks (313). In one or more embodiments, the model builder (333) is configured to divide a subsurface reservoir volume into grid blocks according to a gridding model. In one or more embodiments, the model builder is configured to generate the fracture volumes and assign specific grid blocks to the fracture volumes. In one or more embodiments, the model builder is configured to assign hydraulic transport properties to each grid blocks. In one or more embodiments, the hydraulic transport properties may be specific to grid blocks included in fracture volumes and to grid blocks included in rock matrix volumes.

The model simulator (335) is a software tool configured to simulate a reservoir model (315). In one or more embodiments, the model simulator is configured to calculate the fluid flow of fluids, such as oil, water, and gas, through porous space of a subsurface reservoir and into the wellbores. In one or more embodiments, the model simulator (335) simulates the fractured reservoir model to produce a set of values for the fluid fluxes (319). In one or more embodiments, the model simulator may be a numeric simulator, the numeric simulator solves the fluid flow equations using numeric methods applied on a discrete reservoir model. In one or more embodiments, the model simulator is configured to simulate fluid transport through the grid blocks (313) using fluid transport laws based on conservation of mass, momentum and energy equations with applied boundary conditions. In one or more embodiments, the model simulator may be a multi-phase compositional simulator.

The field equipment module (350) is configured to generate a field operation control signal based at least on a result generated by the E&P computer system (180), such as based on the fluid hydrocarbon production estimate from a reservoir simulation. As noted above, the field operation equipment depicted in FIG. 1 may be controlled by the field operation control signal. For example, the field operation control signal may be used to control drilling equipment, an actuator, a fluid valve, or other electrical and/or mechanical devices disposed about the fields (101) and (102). In one or more embodiments, field equipment module (350) is configured to acquire a set of data from the field regarding one or more properties of the subsurface formations.

While FIG. 3 shows a configuration of components, other configurations may be used without departing from the scope. For example, various components may be combined to create a single component. As another example, the functionality performed by a single component may be performed by two or more components.

FIG. 4.1 and FIG. 4.2 show flowcharts in accordance with one or more embodiments. While the various blocks in these flowcharts are presented and described sequentially, one of ordinary skill will appreciate that at least some of the blocks may be executed in different orders, may be combined or omitted, and at least some of the blocks may be executed in parallel. Furthermore, the blocks may be performed actively or passively. For example, some blocks may be performed using polling or be interrupt driven in accordance with one or more embodiments. By way of an example, determination blocks may not use a processor to process an instruction unless an interrupt is received to signify that condition exists in accordance with one or more embodiments. As another example, determination Blocks may be performed by performing a test, such as checking a data value to test whether the value complies with the tested condition in accordance with one or more embodiments.

FIG. 4.1 shows a flowchart for simulating fluid flow in a fractured reservoir in accordance with one or more embodiments. In one or more embodiments, the flowchart in FIG. 4.1 presents an HG-CFE model implementation.

In Block 453, a grid is generated for a fractured reservoir model that includes a fracture and a matrix. A virtual grid that spans the fractured reservoir and partitions the volume of the fractured reservoir is defined, such that each grid block in the virtual grid has a corresponding location in the fractured reservoir. Further, each location in the fractured reservoir has a corresponding grid block. Values of physical properties are assigned to the grid blocks using the data acquisition tools deployed across the fields as depicted in FIG. 1 above. In particular, the data acquisition tools may obtain some of the values directly. Other values may be calculated based on the obtained values.

In Block 455, a volume expansion parameter is selected for the cross flow equilibrium elements. A default value that is preconfigured may be used for the volume expansion parameter. By way of another example, the volume expansion parameter may be received via a user interface or application programming interface.

In Block 456, cross flow equilibrium elements are generated based on the generated grid and the volume expansion parameter. The generated grid defines the locations of the fractures and the matrix elements in the computational space. The actual volumes of the fractures may be determined based on data acquired using the data acquisition tools described above with reference to FIG. 1. The fractures are expanded in size according to the volume expansion parameter. In particular the volume expansion parameter defines the amount that the fracture is expanded. In one or more embodiments, the fracture is expanded in equidistant amount in each direction, from the actual fracture volume, as defined by the volume expansion parameter.

In Block 457, pore volume and transmissibility multipliers are calculated, using physical properties for the plurality of CFE elements. In one or more embodiments, the pore volume multiplier and the transmissibility multiplier is calculated based on a percentage of the CFE element that is matrix and the percentage of the CFE element that is fracture. The percentage of the CFE element that is matrix is multiplied by the pore volume and transmissibility multiplier of the matrix to obtain a first result. The percentage of the CFE element that is fracture is multiplied by the pore volume multiplier of the fracture to obtain a second result. The first result and the second result are combined, such as summed, respectively, to obtain the pore volume and transmissibility multipliers, respectively, for the CFE element. Thus, the CFE element has pore volume and transmissibility multipliers that is a combination of the pore volume and transmissibility multipliers for the matrix and fracture. In one or more embodiments, the pore volume and transmissibility multipliers are defined for physical properties of the CFE element. For example, the pore volume and transmissibility multipliers may be defined for volume, porosity, permeability, net-to-gross, gas, oil, water and transmissibility.

In Block 461, fluid flow is simulated in the fractured reservoir model using the pore volume and transmissibility multipliers and a fracture relative permeability curve to obtain a result. The fluid flow is calculated for the cross-flow equilibrium elements. The fluid flow may also be calculated across the matrix elements and between CFE elements. Because the pore volume and transmissibility multipliers being calculated using both the physical properties of the matrix and the fracture, fluid flow across a CFE element accounts for the fact that the CFE element represents a combination of fracture and matrix.

The fluid flow between CFE elements may be calculated using a star delta approach. Specifically, a CFE element may connect at a single point to at least two other CFE element (e.g., in a star pattern having a center point of intersection). The fluid flow between any two of the joining CFE elements is the deemed the same as if the CFE elements were connected as a triangle (e.g., delta) without the central intersection. Thus, fluid flow between CFE elements is calculated as if the CFE elements were arranged in a delta pattern.

In the case of a constant fracture aperture and an isotropic medium, the CFE element to CFE element, may be estimated as a weighted average of the fracture and matrix relative permeability curves. For example, the phase relative permeability may be calculated using the following equation, Eq. 1.

$$k_{r\alpha,CFE} = (1 - a/A)\frac{K_m}{K_f}k_{r\alpha,m} + (a/A)k_{r\alpha,f} \qquad \text{(Eq. 1)}$$

In equation Eq. 1, $k_{r\alpha,CFE}$ is the fracture relative permeability of the CFE element, $\alpha$ is the size of the fracture aperture, A is the area of the crossflow element, Km is the absolute permeability of the matrix element, $K_f$ is the absolute permeability of the fracture, $k_{r\alpha,m}$ is the relative permeability of the matrix, and $k_{r\alpha,f}$ is the relative permeability of the fracture.

The fluid flow from a fracture to a matrix may be calculated using the fracture relative permeability curve of the fracture. In other words, the relative permeability of the fracture rather than the relative permeability of the matrix may be used to calculate fluid flow.

The simulations calculate the path and rate of fluid flows through the tight reservoir. From the simulations, information about the composition of fluid, timing for hydrocarbon, and other information may be determined. The result that is calculated may be a dynamic result showing changes over time, and/or a static result that provides information for a single point in time.

In Block 463, the result is presented. The result may be presented to another application, such as using an application programming interface, placed in storage, using a graphical user interface, or via another presentation technique. In one or more embodiments, the result is presented to a user via a user interface in the surface unit depicted in FIG. 1 above. In one or more embodiments, the result is presented by sending to a software and/or hardware component of the exploration and production (E&P) computer system or wellsite systems depicted in FIG. 1 above.

A field operation may be performed in response to presenting the packer position and choking parameter. In one or more embodiments, the field operation is performed as described in reference to FIG. 1 above.

FIG. 4.2 shows a flowchart for calculating fluid fluxes in accordance with one or more embodiments. One or more blocks of FIG. 4.2 may be added to and/or replace one or more blocks of FIG. 4.1. In Block 400, a set of hydraulic transport properties are read from memory. In Block 401, a set of fractures are generated. In one or more embodiments, the fracture space is associated with a set of grid blocks with small volume and high porosity.

In Block 402, a set of grid blocks are generated using a hybrid grid mesh. In one or more embodiments, a model builder generates the grid blocks by dividing the reservoir volume using a regular mesh, an irregular mesh or any combination of meshes. In one or more embodiments, the model builder may use a mesh to generate grid blocks for rock matrix volume and a different mesh for fractures volume.

In Block 403, a pore volume scaling factor is selected. In Block 404, a fracture hydraulic transmissivity scaling factor is selected. In Block 405, a test is performed to determine if the fracture aperture distribution is isotropic. In one or more embodiments, a fracture aperture is considered isotropic is the changes in hydraulic transport properties are equal in various directions.

In Block 406, if the fracture aperture distribution is isotropic, a scaled CFE-CFE relative permeability is calculated for each block. For example, the scaled CFE-CFE relative permeability may be calculated using the above equation, Eq. 1.

In Block 407, if the fracture aperture distribution is not isotropic, a fracture relative permeability is calculated transversal to CFE for each block. In one or more embodiments, fractures grid blocks are combined with a small fraction of the rock matrix grid blocks on either side of the fracture in order to generate combined grid blocks.

In Block 408, the fluid fluxes across blocks are calculated based on relative permeability. In one or more embodiments, the model simulator calculates fluxes by integrating the appropriate fluxes for the rock matrix grid blocks and fracture grid blocks.

In Block 409, the fluid fluxes are presented. For example, the fluid fluxes may be presented as described above with respect to Block 463 in FIG. 4.1.

Figure 5:
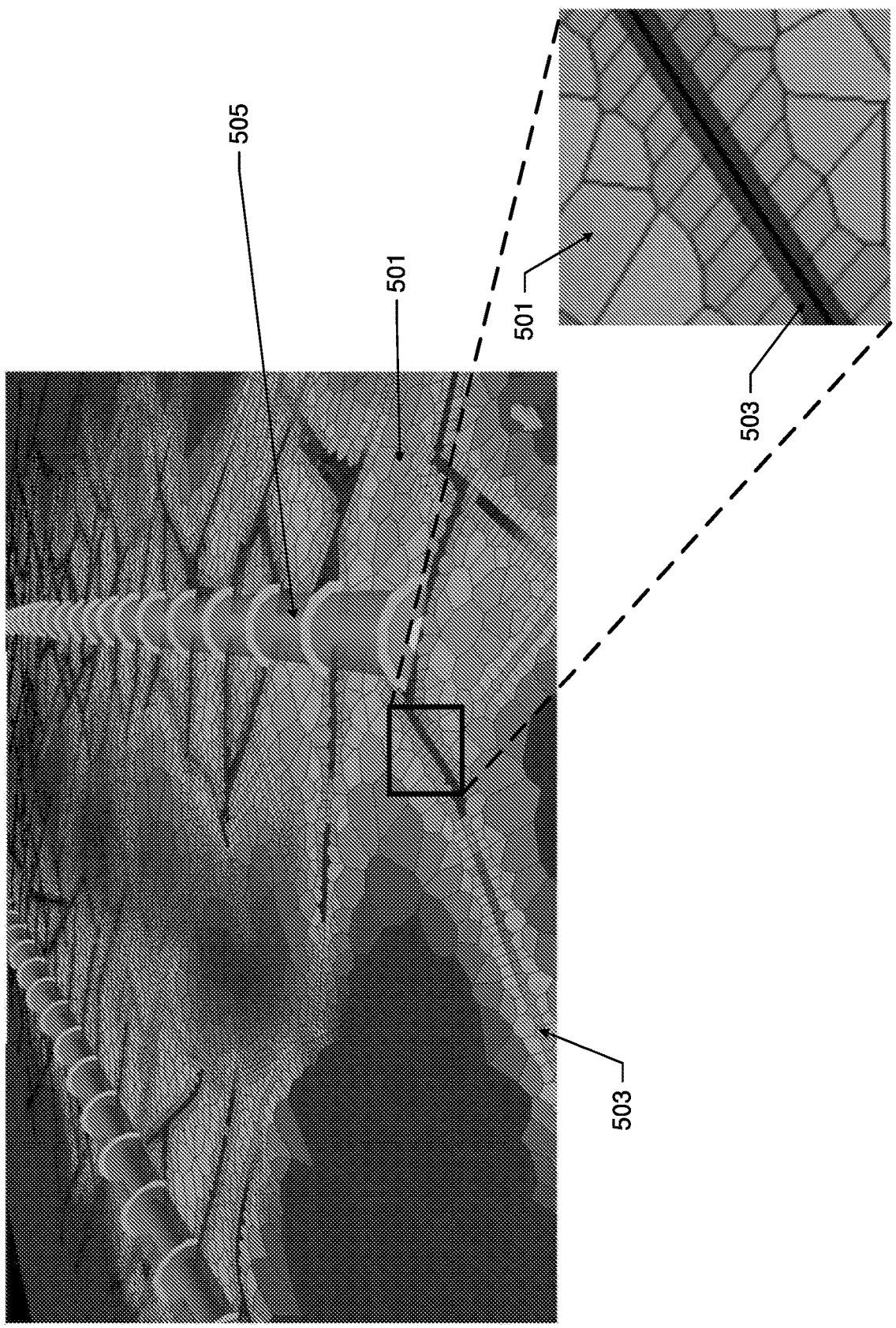

FIG. 5 shows a portion of a fractured reservoir divided into grid blocks. In one or more embodiments, the grid blocks (501) are shaded according to a shaded map scale that represent the value of a hydraulic transport property. As seen in FIG. 5, the grid blocks associated with the rock matrix (501) have large difference in hydraulic transport property than the grid blocks associated with the fractures (503). In one or more embodiments, the grid blocks associated with the fractures (503) are connected with the wellbore (505) facilitating transfer of fluids between the reservoir and the wellbore.

The fracture network topology and the high contrast between fracture and matrix properties may be very challenging during a simulation process. Different types of models are used to represent tight reservoir. For example, FIG. 6.1 illustrates single porosity (SP) model (600) in two dimensional space. The matrix blocks are adjacent to the fractures. The matrix block represents rock space. At the intersection of the fractures, a small fracture pore volume exists. Due to the contrast in matrix/fracture properties, numerical simulations are computationally very expensive in the single porosity model.

FIG. 6.2 illustrates a hybrid grid model (602). In the hybrid grid model, grid blocks from different dimensional spaces are combined. The hybrid grid model uses two spaces: (i) a grid space where the fracture's dimension is reduced by 1 (604), and (ii) a computational space where the matrix and fractures are drawn in the same dimension (606). In the hybrid grid, the point at the intersection (denoted in FIG. 6.1 as a black dot), is removed. In other words, a control volume is not added to the fracture intersection in the model to consider the fracture to fracture intersection.

FIG. 6.3 illustrates a CFE model (608). In both the single porosity and hybrid grid models, different pressures are calculated in the fracture and adjacent matrix cells. To achieve computational efficiency, the CFE methodology combines fractures with a small fraction of the matrix blocks on either side in larger computational elements using the assumption that a large permeability, but small pressure gradient across the fracture-matrix interface results in a transverse flux that instantaneously equilibrates the fracture fluid with the fluid immediately next to it in the matrix.

FIG. 6.4 shows a HG-CFE model (610) in accordance with one or more embodiments. In the HG-CFE model, the combined fracture-matrix elements may be denoted as CFE elements (614). The fluxes across the edges of the CFE elements may be determined by integrating the appropriate Darcy fluxes for the matrix and fracture contributions. The CFE treatment of fractures allows coarser grids, which translates into large CFL time-steps and increased computational efficiency. The efficiency of the pressure update is also improved, because of the lower contrast in CF fracture and matrix permeabilities. As shown in model (612), a larger control volume is created to calculate contribution from the fracture and the matrix. A larger control volume means that simulations may no longer be performed with small fractures (e.g., the pore volume is larger.).

One or more embodiments may provide for the integration of flow equations in the CFE elements related to fracture-fracture flow. For fracture-matrix interaction, the relative permeability of the fracture is used to calculate the flow from the fracture to the matrix. Using a general purpose finite volume simulator, a sensitivity analysis with respect to the relative permeability curve is performed to calculate the fracture-matrix flow. Using the fracture relative permeability curve provided an accurate approximation as the flow is initiated from the center of the control volume, with the CFE element assumed symmetric with respect to the topology of the fracture. While the relative permeability of the matrix for flow from fracture to matrix may be used with a CFE method, embodiments herein may use the fracture relative permeability curve (relative permeability of the fracture) instead of the relative permeability of the matrix.

In one or more embodiments, the fracture network is gridded using lower dimensional fractures as shown in model (616). Then, the cross-flow equilibrium elements properties are determined in the computational space as shown in model (612). As shown, complex fracture networks are handled as gridding of lower dimensional fractures. Computation speed is increased (fewer time-steps) as the cross flow equilibrium application is applied in the computational space, thereby eliminating the grid effect. Fracture volume expansion is calculated exactly without including the expansion in the grid space. Running sensitivity analysis with respect the volume of the expanded fractures (i.e. volume of the CFE elements) is efficient, as re-gridding of the fractured system is not performed in one or more embodiments.

Expanding the fracture cells volume through CFE concept is associated with pore volume and transmissibility changes in the fracture system. If the CFE elements are designed explicitly in the grid space, the simulator may handle the pore volume calculation, in proportion, and based on the fracture and matrix properties. The transmissibility calculation between CFE elements is straight forward performed given the area open to flow from both original fracture and matrix parts inside the CFE element.

As shown, the CFE elements do not show up in the grid space and calculations are performed in the computational space using the exact expressions. A grid of fractured reservoirs may be generated, using one dimensional fractures in two dimensional reservoirs, and two dimensional fractures in three dimensional reservoirs.

Figure 7:
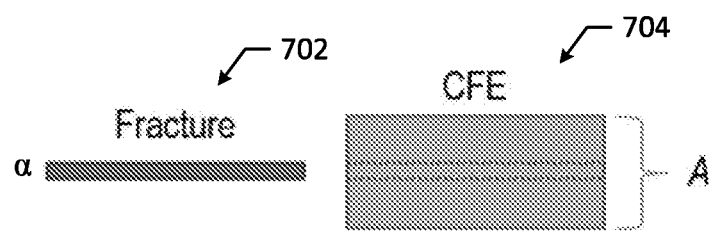

FIG. 7 shows an example of expanding a fracture to create a CFE element. In FIG. 7, the fracture and the CFE element are two dimensional. The fracture (702) has an area a. The fracture volume expansion parameter A is selected as shown in FIG. 7 and use to create CFE element 704 of having an area of A. Based on the value of A, pore volume and transmissibility multipliers are calculated using both the fracture and matrix properties in the CFE elements.

The following is an example set of equations that may be used to calculate fluid flow using the HG-CFE method. In one or more embodiments, the fluid flow mathematical description is based on the principle of mass conservation that is the accumulation of mass in some domain that is exactly balanced by the mass flowing through the boundary of the domain and the contribution of sources/sinks within the domain. The material balance equation for component i is given by equations, Eq. 2 and Eq. 3.

$$\frac{\partial M_i}{\partial t} + \nabla \cdot U_i = F_i, i = 1, n_c, \quad \text{(Eq. 2)}$$

where, $$U_i = \sum_\alpha x_{i\alpha} b_\alpha v_\alpha. \quad \text{(Eq. 3)}$$

In the equations Eq. 2 and Eq. 3, $n_c$ is the number of components in the system, the subscripts $\alpha$ and i denote, respectively, the phase identity (oil, gas or water), and the component, U, is the molar flux of component i, $b_\alpha$ is the molar density of the phase $\alpha$, $x_{i\alpha}$ is the mole fraction of component i in phase $\alpha$, and $F_i$ is the sink/source term for component i.

Each of the volumetric convective phase fluxes is may be calculated using the corresponding Darcy relation in equation Eq. 4.

$$v_\alpha = \lambda_\alpha K(\nabla p_\alpha - \rho_\alpha g), \alpha = o, g. \quad \text{(Eq. 4)}$$

in terms of gravitational acceleration g, permeability tensor K, mobility $\lambda_\alpha$ ($S_\alpha$), saturation $S_\alpha$, and mass density $\rho_\alpha$.

The pressure in the three phases are related by capillary pressures may be calculated using equations, Eq. 5 and Eq. 6.

$$p_c(S_o) = p_g - p_o, \quad \text{(Eq.5)}$$

$$p_c(S_w) = p_o - p_w, \quad \text{(Eq. 6)}$$

In equations Eq. 5 and Eq. 6, $S_o$ and $S_w$ are the saturation of the oil and water phases, respectively. The mole fraction balance implies that $$\sum_{i=1}^{n_c} x_{io} = 1, \sum_{i=1}^{n_c} x_{ig} = 1. \quad \text{(Eq. 7)}$$

When a component partitions in more than one phase, the thermodynamic equilibrium of the component between phases is determined. The equilibrium condition for a component that partitions in two phases $\alpha$ and $\beta$ is that component fugacity in either phase is equal:

$$\varphi_{i\alpha} = \varphi_{i\beta}, \text{ for } i \in \alpha \text{ and } i \in \beta, \forall i, \alpha, \beta \quad \text{(Eq. 8)}$$

where, $\varphi_{i\alpha}$ and $\varphi_{i\beta}$ are the fugacity of component i in phase $\alpha$ and in phase $\beta$, respectively.

To complete the description of the physical model, an initial and boundary conditions are presented below. The initial condition includes the overall composition and pressure field throughout the domain. The boundaries are described by non-overlapping Dirichlet and Neumann conditions. Impermeable boundaries may be used, except in production wells where either a constant pressure or production rate may be determined to exist. Injection wells are placed inside the domain as source terms. Production wells can also be described as sink terms, with impermeable boundaries everywhere.

By way of an example, CFE approximation, equation Eq. 9 may be used. In Equation Eq. 9, below, a is the portion area of a fracture in a CFE of area A. The matrix intersecting area is then calculated as A–a. In other words, A–a is the matrix intersecting area and shows matrix flow. The total flux for a CFE element 'i' (i.e. fracture+matrix) may be calculated as.

$$Q_{i,total}^{jk,\tau} = Q_{i,m}^{jk,\tau} + Q_{i,f}^{jk,\tau} \approx T_{jk}^m \sum_\alpha (\lambda_{\alpha,m}^\tau b_{\alpha,m}^\tau x_{i\alpha,m}^\tau)^* (\Phi_{\alpha,m}^j - \Phi_{\alpha,m}^k) + \quad \text{(Eq. 9)}$$

$$T_{jk}^f \sum_\alpha (\lambda_{\alpha,f}^\tau b_{\alpha,m}^\tau x_{i\alpha,m}^\tau)^* (\Phi_{\alpha,m}^j - \Phi_{\alpha,m}^k)$$

In equation Eq. (9), $T_{jk}$ denotes the transmissibility constant between control volumes j and k. The subscripts f and m refer to fracture and matrix. The variables $\lambda$, b, $\Phi$, x, and $\tau$ are the phase mobility, molar density, potential, the component mole fraction in the related phase $\alpha$, and linear iteration number, respectively. The phase potential includes the phase pressure and the capillary pressure and gravity forces. The superscript * denotes the upstream direction for each phase and for each connection.

For non-zero capillary pressure and assuming a same phase pressure in both fracture and matrix in the cross-flow equilibrium element, the phase potential in the matrix can be calculated using equation Eq. 10.

$$\Phi_{\alpha,m}^j - \Phi_{\alpha,m}^k = P^j - P^k - \frac{1}{2}(\rho_\alpha^j + \rho_\alpha^k)g(d^j + d^k) + \quad \text{(Eq. 10)}$$

$$P_{c\alpha,m}^j - P_{c\alpha,m}^k$$

$$= \Delta\Psi^{jk} + \Delta P_{c\alpha,m}^{jk}$$

Similarly, the phase potential in the fracture may be calculated using equation, Eq. 11.

$$\Phi_{\alpha,f}^j - \Phi_{\alpha,f}^k = P^j - P^k - \frac{1}{2}(\rho_\alpha^j + \rho_\alpha^k)g(d^j + d^k) + \quad \text{(Eq. 11)}$$

$$P_{c\alpha,f}^j - P_{c\alpha,f}^k$$

$$= \Delta\Psi^{jk} + \Delta P_{c\alpha,f}^{jk}$$

In the above equations, P is the phase pressure, $\rho$ is the phase density, and d is the cell depth.

Replacing Eqs. (10) and (11), in Eq. (9), equations Eq. 12 may be used.

$$Q_{i,total}^{jk,\tau} = \sum_\alpha (T_{jk}^m k_{r\alpha,m}^\tau + T_{jk}^f k_{r\alpha,f}^\tau) b_\alpha^\tau x_{i\alpha}^\tau/\mu_\alpha^\tau)^* \Delta\Psi^{jk} + \quad \text{(Eq. 12)}$$

$$\sum_\alpha (T_{jk}^m k_{r\alpha,m}^{\tau,*} \Delta P_{c\alpha,m}^{jk} + T_{jk}^f k_{r\alpha,m}^{\tau,*} \Delta P_{c\alpha,f}^{jk})(b_\alpha^\tau x_{i\alpha}^\tau/\mu_\alpha^\tau)^*$$

In a specific example of having zero-capillary pressure, the following equation Eq. 13 may be used.

$$Q_{i,total}^{jk,\tau} = Q_{i,m}^{jk,\tau} + Q_{i,f}^{jk,\tau} \approx \sum_\alpha (T_{jk}^m k_{r\alpha,m}^\tau + T_{jk}^f k_{r\alpha,f}^\tau) b_\alpha^\tau x_{i\alpha}^\tau/\mu_\alpha^\tau)^* \Delta\Psi^{jk} \quad \text{(Eq. 13)}$$

The expression in equation Eq. 6 may be written using equation Eq. 14.

$$Q_{i,total}^{jk,\tau} = Q_{i,m}^{jk,\tau} + Q_{i,f}^{jk,\tau} \approx T_{jk}^f \sum_\alpha \left((1 - a/A)\frac{K_m}{K_f}k_{r\alpha,m}^\tau + \right. \quad \text{(Eq. 14)}$$

$$\left. (a/A)k_{r\alpha,f}^\tau\right) b_\alpha^\tau x_{i\alpha}^\tau/\mu_\alpha^\tau)^* \Delta\Psi^{jk}$$

For isotropic media with constant fracture aperture a, the input relative permeability for fracture elements can be scaled according to the following expression in equation, Eq, 15, to get the relative permeability for the cross-flow equilibrium elements.

$$k_{r\alpha,CFE}^\tau = (1 - a/A)\frac{K_m}{K_f}k_{r\alpha,m}^\tau + (a/A)k_{r\alpha,m}^\tau \quad \text{(Eq. 15)}$$

Furthermore, for isotropic media with constant fracture aperture a, the total flow across the CFE elements can be calculated using equation Eq. 16.

$$Q_{i,total}^{jk,\tau} = Q_{i,m}^{jk,\tau} + Q_{i,f}^{jk,\tau} \approx T_{jk}^f \sum_\alpha (k_{r\alpha,CFE}^\tau b_\alpha^\tau x_{i\alpha}^\tau/\mu_\alpha^\tau)^* \Delta\Psi^{jk} \quad \text{(Eq. 16)}$$

Figure 8:
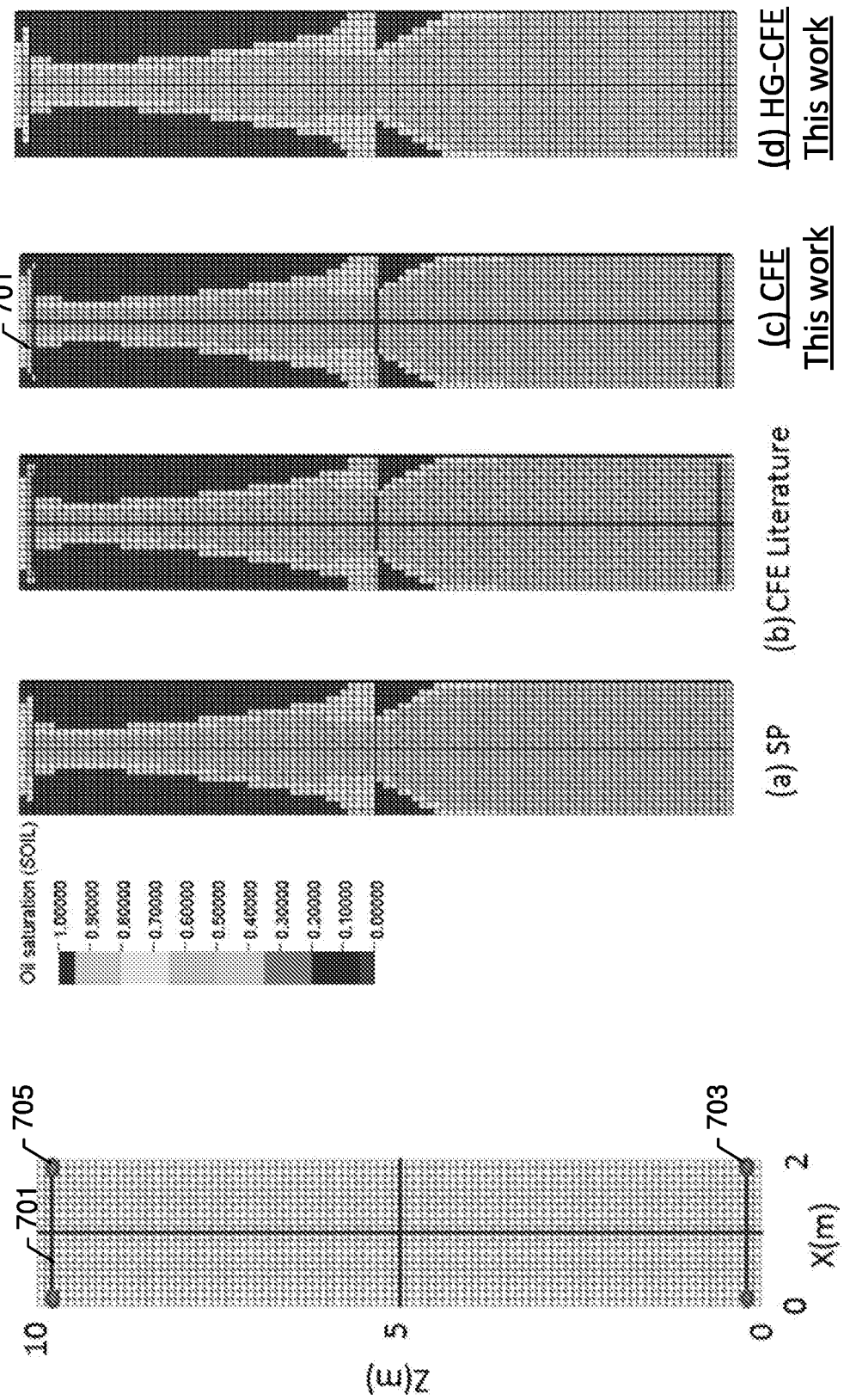

FIGS. 8.1, 8.2, 9, 10, 11, 12, 13, 14, and 15 show examples of simulations in accordance with one or more embodiments. In the examples in the Figures, the following notation is used. "SP" is a single porosity model considered as a reference model. "CFE (literature)" is cross-flow equilibrium concept as presented in literature. "CFE (this work)" is cross-flow equilibrium concept with fracture to matrix flow based on the fracture relative permeability set in accordance with one or more embodiments. "HG-CFE (this work)" is a hybrid grid combined with cross flow equilibrium in accordance with one or more embodiments. Except as described, "CFE (this work)" and "HG-CFE (this work)" methods herein are using scaled relative permeability curves in the fracture.

Turning to FIGS. 8.1 and 8.2, the example shown is a comparison of discrete CFE (this work) and HG-CFE models to SP simulation. In the example, the CFE and HG-CFE models are tested by comparing to a single-porosity (SP) model for a water and CO2 injection strategy applied in a 2 m×10 m column with four matrix blocks. The purpose is to verify that the same results may be obtained with models based on embodiments herein as with a single-porosity simulation, but with a much reduced computer execution time. The reservoir is discretized into 21×103 cells as shown in FIG. 8.1. The dark lines are the fracture cells. The remaining horizontal and vertical lines are matrix blocks. The model is fully saturated with oil. The porosity and the permeability of the matrix are 0.15 and 4 md, respectively. In FIG. 8.1, the third horizontal row from the top (701) is the locations of the fracture cells in each of the models. The original fracture aperture (a) is 5 mm with a porosity 1 and a permeability 4000 md. The CFE cell thickness (A) is 5.5 cm i.e., 11 times the aperture of original fracture.

In the example of FIG. 8.1, 2 injectors (703) and 2 producers (705) are illustrated by ellipses near the bottom and top, respectively. The wells are completed in the fracture cells. Injectors are injecting water and CO2 with a reservoir rate of 0.003 rm3/d for 50 days and 125 days, respectively, and at a BHP limit of 500 bar. Producers are producing at a 0.003 rm3/d rate for 50 days at a BHP limit of 230 bar. Capillary pressures are neglected.

The CFE (this work) is compared to SP and traditional CFE models. The oil saturation profiles is shown in FIG. 8.2 at 1 PV water injection. FIG. 8.2 shows that the improved CFE (this work) model gives much better results in comparison with the traditional CFE (literature), as the results are closer to the SP model reference results on the left of FIG. 8.2. In other words, the SP model is deemed accurate. A comparison at the end of the CO2 injection period shows similar behavior where CFE (this work) model gives more accurate results (not shown).

The same comparisons may be conducted to evaluate the results of HG-CFE (this work) model. As shown in FIG. 8.2, FIG. 9, and FIG. 10, HG-CFE produces a more accurate and efficient approximation as compared to other models when compared to the reference SP model.

Figure 9:
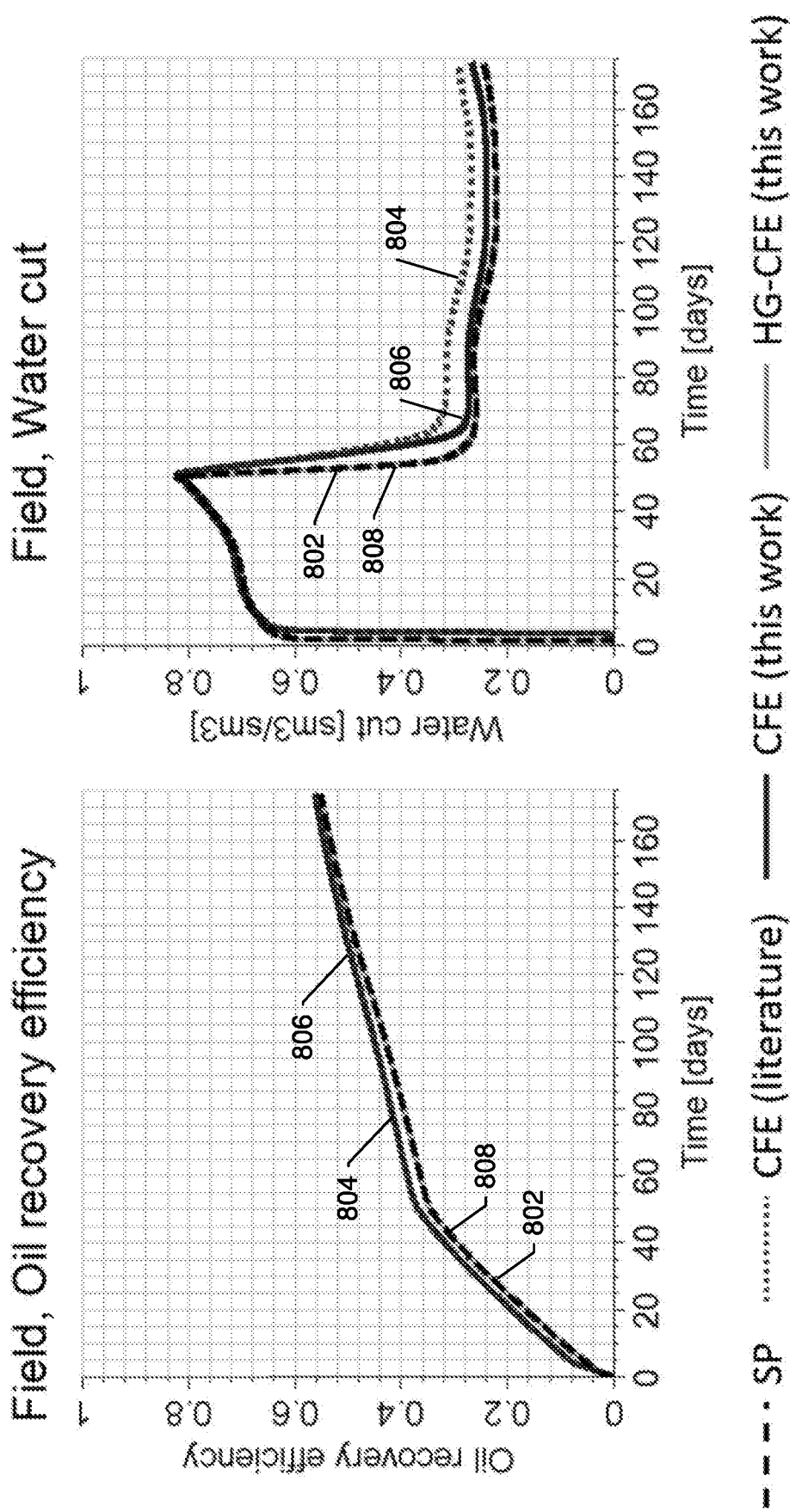

As shown on the right-hand panel of FIG. 9, the SP oil recover results (802) are quite close to the HG-CFE (this work) oil recovery results (808). The CFE (literature) results (804) and CFE (this work) results (806) are not as close to the SP model results (802). On the left-hand side of FIG. 8, the water cut results show that the SP model results (802) and the HG-CFE (this work) results (808) are extremely close. The water cut results for the CFE (this work) method 806 are closer to the SP results (802) than are the results for CFE (literature) (804).

Figure 10:
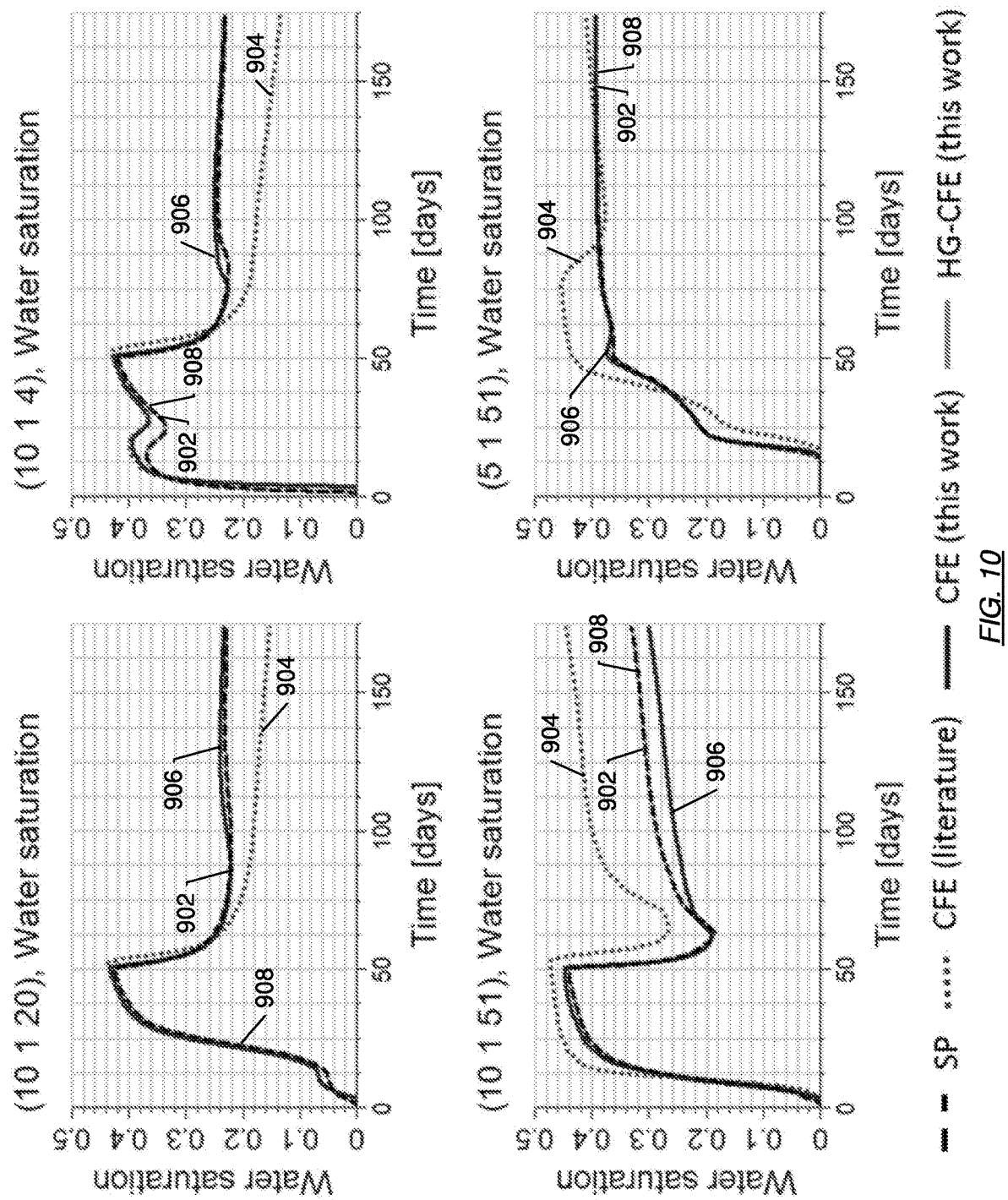

FIG. 10 shows water saturation profiles at selected modeling blocks for the SP model, CFE simulations (literature), CFE and HG-CFE simulations (this work). The results of the HG-CFE method (908) are quite close to the reference SP model results (902). The water saturation profiles of the CFE (this work) (906) are closer to the SP model water saturation profiles (902) than are the CFE (literature) profiles (904).

Figure 11:
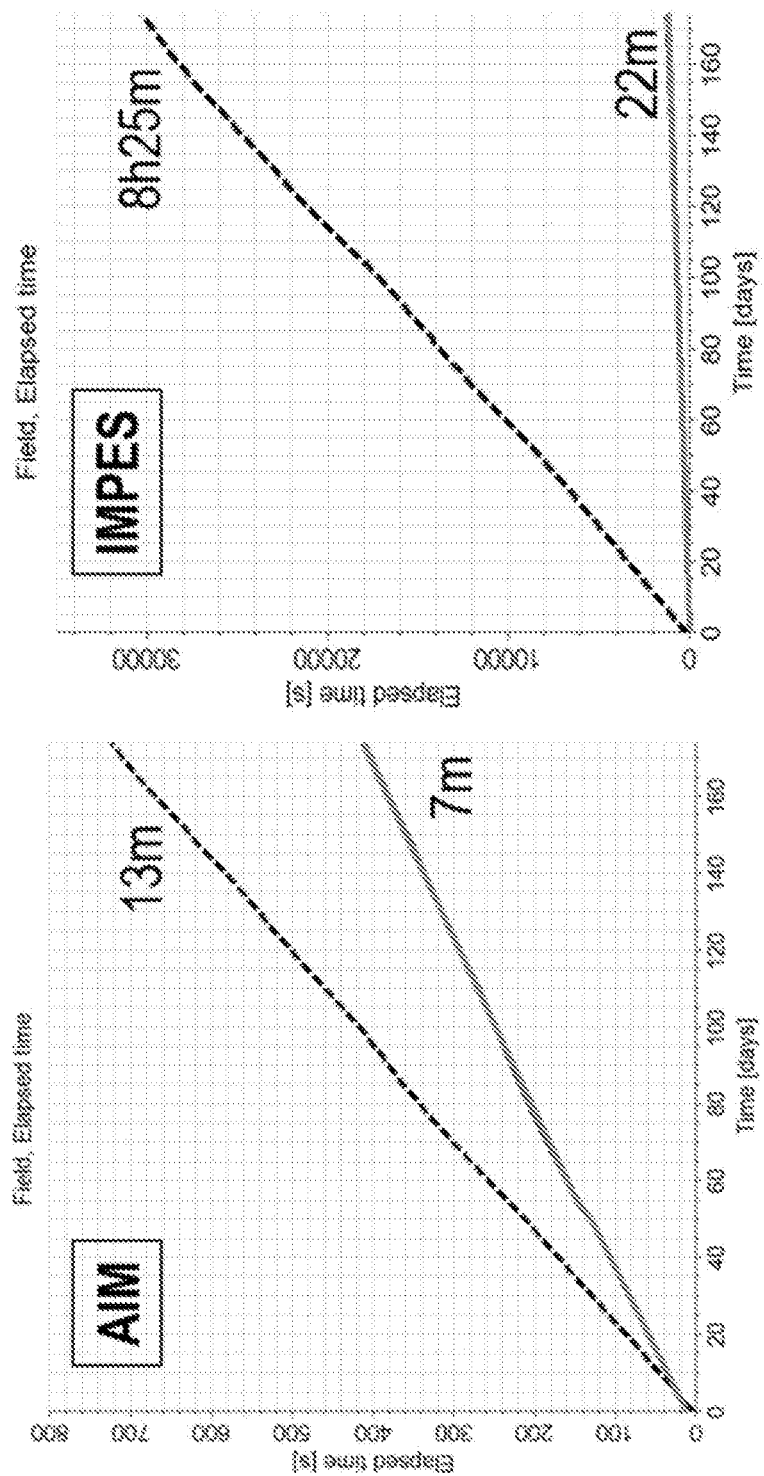
Figure 13:
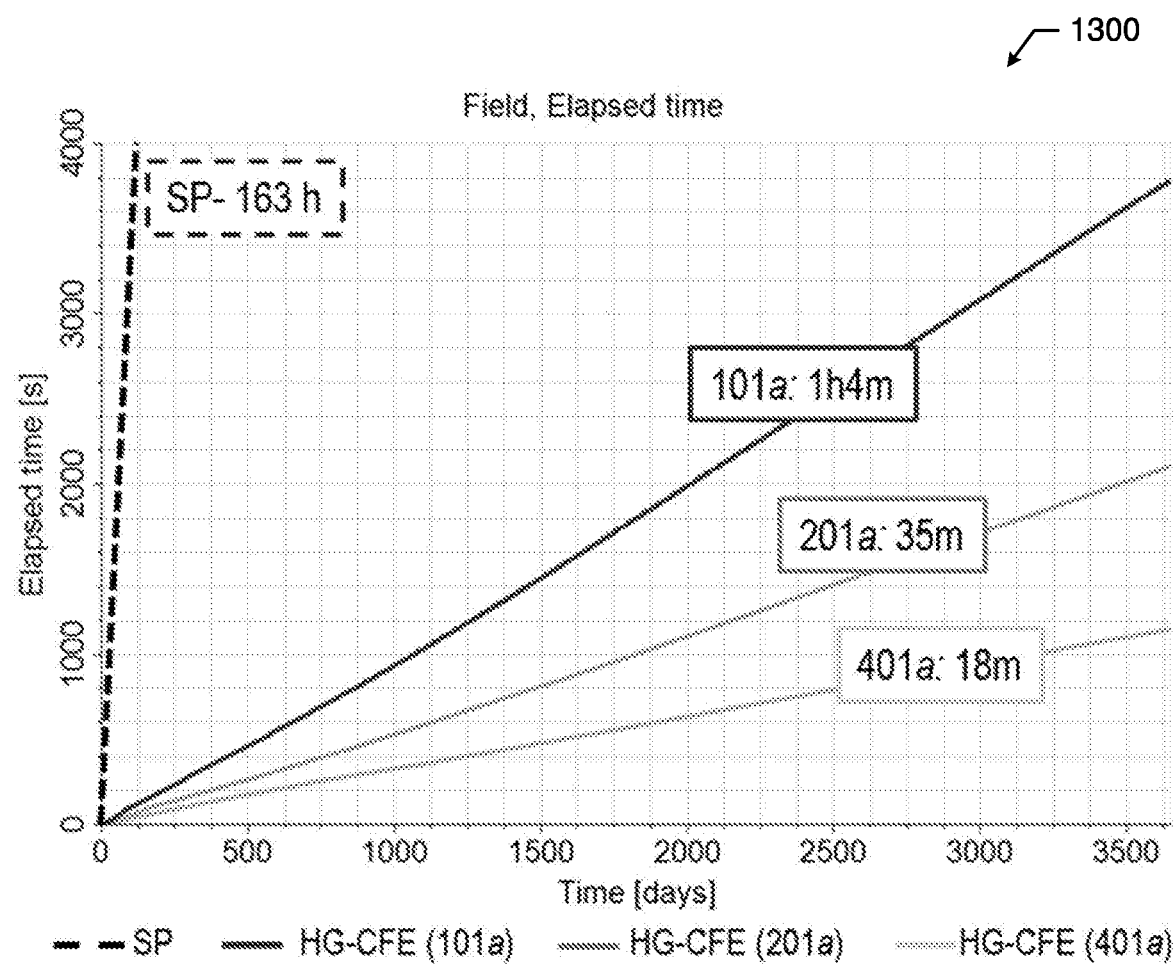
Figure 15:
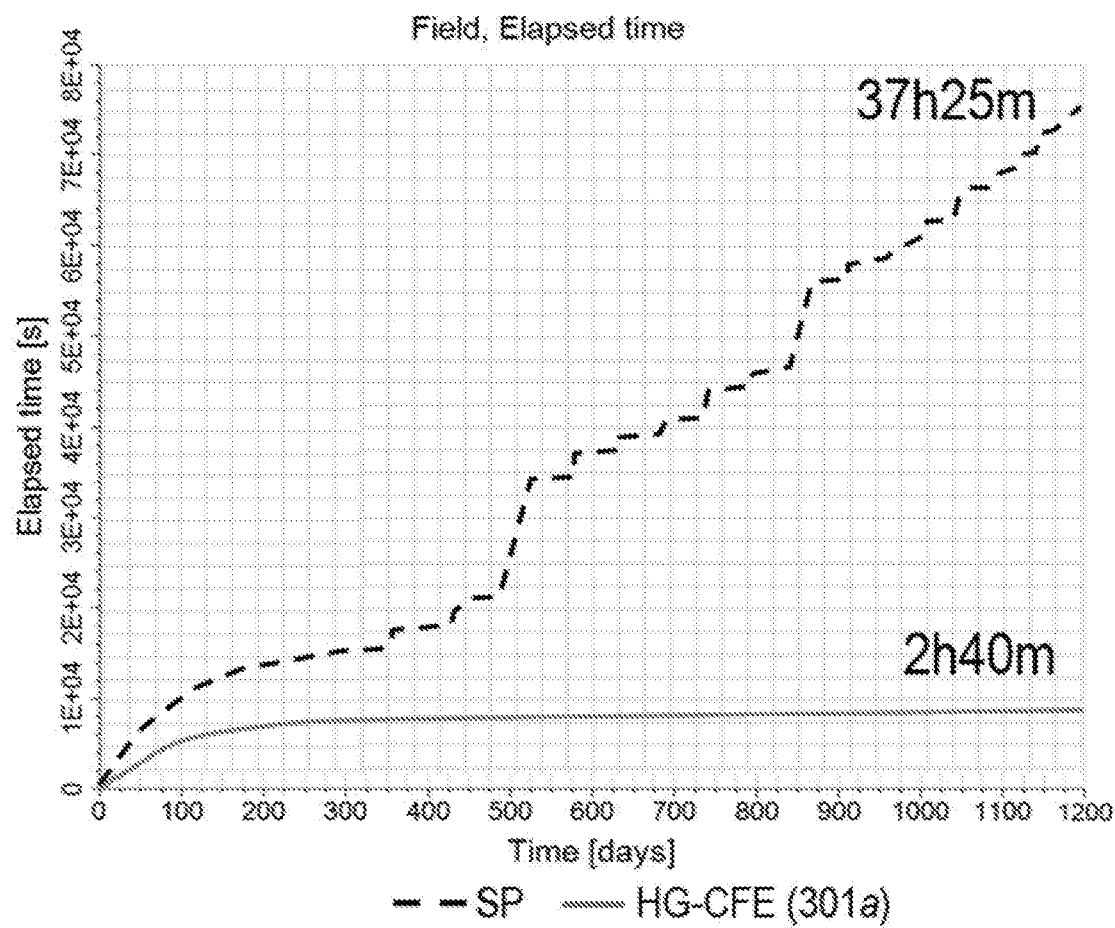

The HG-CFE model eliminates, in addition, grid construction effects near fractures. Using Implicit Pressure Explicit Saturation (IMPES) and Adaptive Implicit Method (AIM) formulations, the simulation run time improvement is shown in graph (1100) in FIG. 11. In FIGS. 11, 13, and 15, the x-axis has the timesteps of the simulation in terms of number of days. Specifically, the x-axis indicates that the simulation has identified the fluid flow at the number of days from the starting time. The y-axis is the elapse time in terms of number of seconds that the computing system has executed the simulation. Thus, the y-axis is an indication of the number of computing resources used to be at the simulated fluid flow time of the x-axis. The, time on the lines is the elapse time at a particular x-axis simulated time.

In FIG. 11, the amount of time to compute the results are shown next to the lines on the graph (e.g., 7 minutes and 13 minutes for HG-CFE and SP, respectively, for AIM, 22 minutes and 8 hours, 25 minutes for HG-CFE and SP, respectively, for IMPES). FIG. 11 shows that HG-CFE method is 2 times faster than SP model for AIM, and 23 times faster for IMPES. The CFE elements thickness is 11 times that of the original fractures. This is equivalent to CFE elements with only 2.5 times bigger pore volume than original fracture cells, and this is in good agreement with the speedup gained using HG-CFE using AIM scheme.

The next example is probably computationally too expensive for a single-porosity simulation and demonstrates the reliability of HG-CFE method. The performance of HG-CFE and SP simulation in 3D complex reservoir uses the same fluid properties and with a more complex network of fractures with fracture thickness of 1 mm. The reservoir dimensions are 600 m×200 m×100 m, with a grid resolution 67×28×10, matrix cell of 10 m×10 m×10 m, and fracture cell of 0.001 m×10 m×10 m. The matrix porosity and permeability are 0.15 and 1 md, respectively. The porosity and permeability in the fracture are, respectively, 1 and 10,000 md. The ratio matrix/fracture pore volume is 1000. In the example, the producer and injector are completed in the matrix cells (not shown). The injector injects water for 10 years and is controlled by reservoir rate at 200 rm3/day with a BHP limit of 1000 bar. The producer produces for 10 years with a reservoir rate control of 200 rm3/day and a BHP limit of 50 bar.

Figure 12:
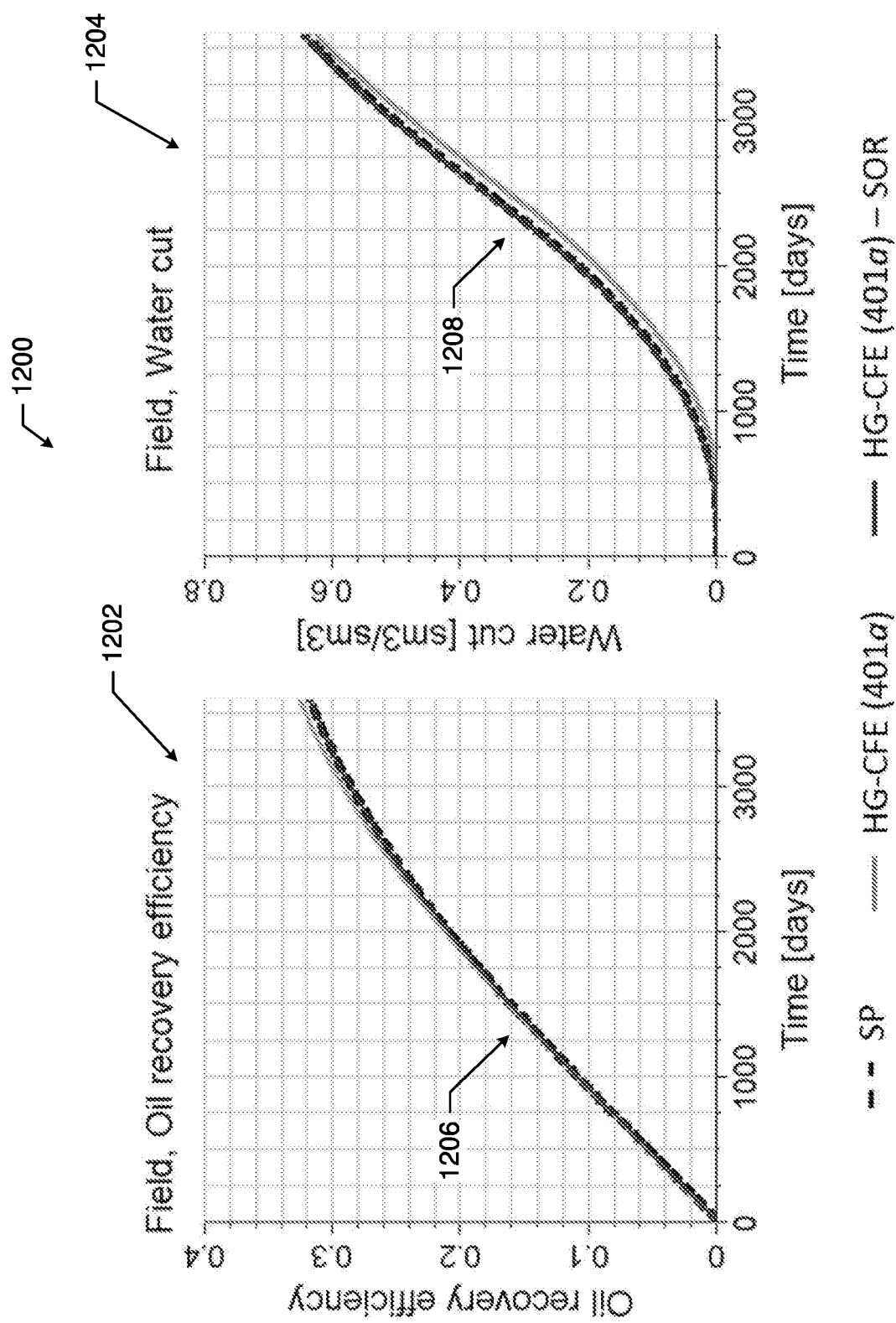

Turning to FIG. 12, a comparison (1200) with SP model and HG-CFE method is performed using different CFE cell expansions of 101, 201, and 401 times (e.g., volume expansion parameter values) to sensitize on both the numerical results and computational complexity. As shown by the lines (1206, 1208) overlapping on both oil recover graph (1202) and the water cut graph (1204), the HG-CFE method gives very accurate results in comparison with the SP reference model. The difference in recovery with SP model for 101, 201 and 401 times larger CFE cells is 0.002%, 0.004% and 0.0065%, respectively. The results demonstrate that the HG-CFE model is retaining a high accuracy while varying the CFE cell volumes. With a smaller CFE expansion, the HG-CFE converges exactly to SP model. Scaling the relative permeability in the fracture to allow the correct amount of water to be initially mobile, the results are even more improved. The HG-CFE with the correction reproduces the exact results of the SP model demonstrating the accuracy of the HG-CFE method. The water saturation profiles also demonstrate a good agreement between the results of SP model and HG-CFE method with 401 times larger CFE cells.

Figure 14:
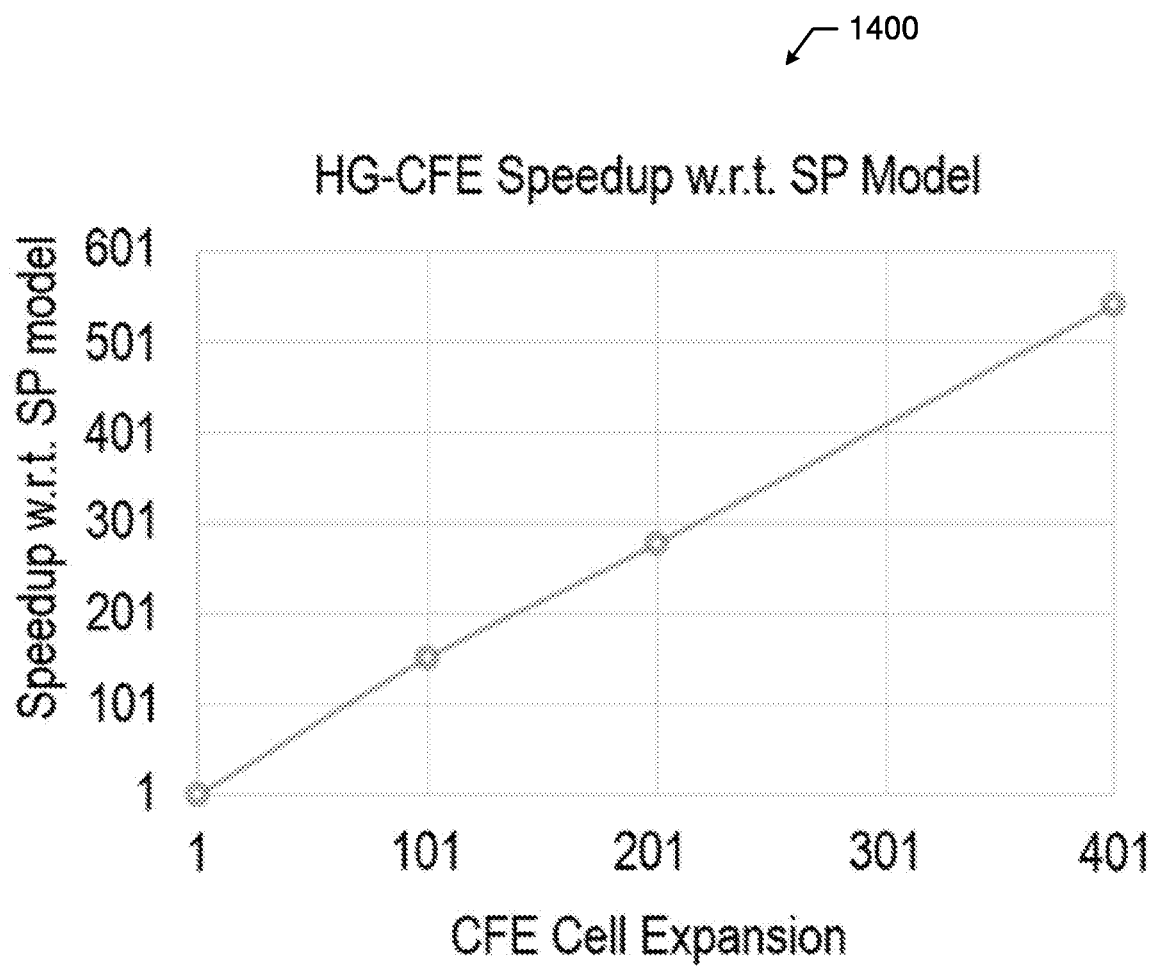

The simulations run time for SP model and HG-CFE cases are shown in the graph (1300) of FIG. 13. In FIG. 13, the amount of time to compute the results using the corresponding technique are shown on the lines on the graph. FIG. 13 shows that for 101, 201 and 401 CFE cell expansion, HG-CFE method is 153, 279 and 543 times faster than SP model. The computational speedup of HG-CFE method with respect to the SP model for the different CFE cell expansions is shown in graph (1400) of FIG. 14.

An HG-CFE assessment in hydraulically fractured reservoir uses a 3D model with a horizontal well that has 9 hydraulic fracture stages. Considering the fluid pumped along with proppant to fracture the well, the initial fluid saturations distribution may be considered in the approximation of HG-CFE method. As initially, the hydraulic fractures are fully saturated with water, the relative permeability curves in the fractures are adjusted as expanding fractures to CFE cells to provide more space for initial oil. Thus, when the production starts, oil is produced along with the pumped water, which is not generally a real behavior even if the volume of water pumped relative to oil reserves is marginal.

To correct the inaccuracy as compared to real behavior, the fluid saturations in the fractures may be calibrated to be $S_w=1/\text{PoreVolumeMultiplier}$, and $S_o=1-S_w$. To achieve the calibrations, the relative permeability in the fracture can be scaled with critical oil saturation equal to $1-1/\text{PoreVolumeMultiplier}$. Using the scaling factor will immobilize the oil portion initially in the fracture which is again marginal with respect to the oil initially in place. A correction to the mobilized oil can be performed to account to the part immobilized in the expanded CFE cells. In the example, the CFE multiplier in thickness is 301, which means 4 times the pore volume of the original fractures and that leads to initial fluid saturations of 0.25 water and 0.75 oil.

The strategy for the horizontal producer is 10 years' production with liquid rate control of 50 STB/day and a BHP limit of 600 psi. The results for the SP model and the HG-CFE method with 301 times CFE cell expansion demonstrate agreement between the SP model and the HG-CFE method, as confirmed with previous examples. The HG-CFE method produces very accurate results that matches the SP model. Finally, the simulation run time as shown in graph (1400) of FIG. 15 reveals that, for this example, HG-CFE method is 14 times faster than SP model.

Embodiments may be implemented on a computing system. Any combination of mobile, desktop, server, router, switch, embedded device, or other types of hardware may be used. For example, as shown in FIG. 16.1, the computing system (1600) may include one or more computer processors (1602), non-persistent storage (1604) (e.g., volatile memory, such as random access memory (RAM), cache memory), persistent storage (1606) (e.g., a hard disk, an optical drive such as a compact disk (CD) drive or digital versatile disk (DVD) drive, a flash memory, etc.), a communication interface (1612) (e.g., Bluetooth interface, infrared interface, network interface, optical interface, etc.), and numerous other elements and functionalities.

The computer processor(s) (1602) may be an integrated circuit for processing instructions. For example, the computer processor(s) may be one or more cores or micro-cores of a processor. The computing system (1600) may also include one or more input devices (1610), such as a touchscreen, keyboard, mouse, microphone, touchpad, electronic pen, or any other type of input device.

The communication interface (1612) may include an integrated circuit for connecting the computing system (1600) to a network (not shown) (e.g., a local area network (LAN), a wide area network (WAN) such as the Internet, mobile network, or any other type of network) and/or to another device, such as another computing device.

Further, the computing system (1600) may include one or more output devices (1608), such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) (1602), non-persistent storage (1604), and persistent storage (1606). Many different types of computing systems exist, and the aforementioned input and output device(s) may take other forms.

Software instructions in the form of computer readable program code to perform embodiments may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments.

The computing system (1600) in FIG. 16.1 may be connected to or be a part of a network. For example, as shown in FIG. 16.2, the network (1620) may include multiple nodes (e.g., node X (1622), node Y (1624)). Each node may correspond to a computing system, such as the computing system shown in FIG. 16.1, or a group of nodes combined may correspond to the computing system shown in FIG. 16.1. By way of an example, embodiments may be implemented on a node of a distributed system that is connected to other nodes. By way of another example, embodiments may be implemented on a distributed computing system having multiple nodes, where each portion may be located on a different node within the distributed computing system. Further, one or more elements of the aforementioned computing system (1600) may be located at a remote location and connected to the other elements over a network.

Although not shown in FIG. 16.2, the node may correspond to a blade in a server chassis that is connected to other nodes via a backplane. By way of another example, the node may correspond to a server in a data center. By way of another example, the node may correspond to a computer processor or micro-core of a computer processor with shared memory and/or resources.

The nodes (e.g., node X (1622), node Y (1624)) in the network (1620) may be configured to provide services for a client device (1626). For example, the nodes may be part of a cloud computing system. The nodes may include functionality to receive requests from the client device (1626) and transmit responses to the client device (1626). The client device (1626) may be a computing system, such as the computing system shown in FIG. 16.1. Further, the client device (826) may include and/or perform at least a portion of one or more embodiments.

The computing system or group of computing systems described in FIGS. 16.1 and 16.2 may include functionality to perform a variety of operations disclosed herein. For example, the computing system(s) may perform communication between processes on the same or different system. A variety of mechanisms, employing some form of active or passive communication, may facilitate the exchange of data between processes on the same device. Examples representative of these inter-process communications include, but are not limited to, the implementation of a file, a signal, a socket, a message queue, a pipeline, a semaphore, shared memory, message passing, and a memory-mapped file. Further details pertaining to a couple of these non-limiting examples are provided below.

Based on the client-server networking model, sockets may serve as interfaces or communication channel endpoints enabling bidirectional data transfer between processes on the same device. Foremost, following the client-server networking model, a server process (e.g., a process that provides data) may create a first socket object. Next, the server process binds the first socket object, thereby associating the first socket object with a unique name and/or address. After creating and binding the first socket object, the server process then waits and listens for incoming connection requests from one or more client processes (e.g., processes that seek data). At this point, when a client process wishes to obtain data from a server process, the client process starts by creating a second socket object. The client process then proceeds to generate a connection request that includes at least the second socket object and the unique name and/or address associated with the first socket object. The client process then transmits the connection request to the server process. Depending on availability, the server process may accept the connection request, establishing a communication channel with the client process, or the server process, busy in handling other operations, may queue the connection request in a buffer until server process is ready. An established connection informs the client process that communications may commence. In response, the client process may generate a data request specifying the data that the client process wishes to obtain. The data request is subsequently transmitted to the server process. Upon receiving the data request, the server process analyzes the request and gathers the requested data. Finally, the server process then generates a reply including at least the requested data and transmits the reply to the client process. The data may be transferred, more commonly, as datagrams or a stream of characters (e.g., bytes).

Shared memory refers to the allocation of virtual memory space in order to substantiate a mechanism for which data may be communicated and/or accessed by multiple processes. In implementing shared memory, an initializing process first creates a shareable segment in persistent or non-persistent storage. Post creation, the initializing process then mounts the shareable segment, subsequently mapping the shareable segment into the address space associated with the initializing process. Following the mounting, the initializing process proceeds to identify and grant access permission to one or more authorized processes that may also write and read data to and from the shareable segment. Changes made to the data in the shareable segment by one process may immediately affect other processes, which are also linked to the shareable segment. Further, when one of the authorized processes accesses the shareable segment, the shareable segment maps to the address space of that authorized process. Often, only one authorized process may mount the shareable segment, other than the initializing process, at any given time.

Other techniques may be used to share data, such as the various data described in the present application, between processes without departing from the scope. The processes may be part of the same or different application and may execute on the same or different computing system.

Rather than or in addition to sharing data between processes, the computing system performing one or more embodiments may include functionality to receive data from a user. For example, in one or more embodiments, a user may submit data via a graphical user interface (GUI) on the user device. Data may be submitted via the graphical user interface by a user selecting one or more graphical user interface widgets or inserting text and other data into graphical user interface widgets using a touchpad, a keyboard, a mouse, or any other input device. In response to selecting a particular item, information regarding the particular item may be obtained from persistent or non-persistent storage by the computer processor. Upon selection of the item by the user, the contents of the obtained data regarding the particular item may be displayed on the user device in response to the user's selection.

By way of another example, a request to obtain data regarding the particular item may be sent to a server operatively connected to the user device through a network. For example, the user may select a uniform resource locator (URL) link within a web client of the user device, thereby initiating a Hypertext Transfer Protocol (HTTP) or other protocol request being sent to the network host associated with the URL. In response to the request, the server may extract the data regarding the particular selected item and send the data to the device that initiated the request. Once the user device has received the data regarding the particular item, the contents of the received data regarding the particular item may be displayed on the user device in response to the user's selection. Further to the above example, the data received from the server after selecting the URL link may provide a web page in Hyper Text Markup Language (HTML) that may be rendered by the web client and displayed on the user device.

Once data is obtained, such as by using techniques described above or from storage, the computing system, in performing one or more embodiments, may extract one or more data items from the obtained data. For example, the extraction may be performed as follows by the computing system in FIG. 16.1. First, the organizing pattern (e.g., grammar, schema, layout) of the data is determined, which may be based on one or more of the following: position (e.g., bit or column position, Nth token in a data stream, etc.), attribute (where the attribute is associated with one or more values), or a hierarchical/tree structure (consisting of layers of nodes at different levels of detail-such as in nested packet headers or nested document sections). Then, the raw, unprocessed stream of data symbols is parsed, in the context of the organizing pattern, into a stream (or layered structure) of tokens (where each token may have an associated token "type").

Next, extraction criteria are used to extract one or more data items from the token stream or structure, where the extraction criteria are processed according to the organizing pattern to extract one or more tokens (or nodes from a layered structure). For position-based data, the token(s) at the position(s) identified by the extraction criteria are extracted. For attribute/value-based data, the token(s) and/or node(s) associated with the attribute(s) satisfying the extraction criteria are extracted. For hierarchical/layered data, the token(s) associated with the node(s) matching the extraction criteria are extracted. The extraction criteria may be as simple as an identifier string or may be a query presented to a structured data repository (where the data repository may be organized according to a database schema or data format, such as XML).

The extracted data may be used for further processing by the computing system. For example, the computing system of FIG. 16.1, while performing one or more embodiments, may perform data comparison. Data comparison may be used to compare two or more data values (e.g., A, B). For example, one or more embodiments may determine whether A>B, A=B, A!=B, A<B, etc. The comparison may be performed by submitting A, B, and an opcode specifying an operation related to the comparison into an arithmetic logic unit (ALU) (i.e., circuitry that performs arithmetic and/or bitwise logical operations on the two data values). The ALU outputs the numerical result of the operation and/or one or more status flags related to the numerical result. For example, the status flags may indicate whether the numerical result is a positive number, a negative number, zero, etc. By selecting the proper opcode and then reading the numerical results and/or status flags, the comparison may be executed. For example, in order to determine if A>B, B may be subtracted from A (i.e., A−B), and the status flags may be read to determine if the result is positive (i.e., if A>B, then A−B>0). In one or more embodiments, B may be considered a threshold, and A is deemed to satisfy the threshold if A=B or if A>B, as determined using the ALU. In one or more embodiments, A and B may be vectors, and comparing A with B includes comparing the first element of vector A with the first element of vector B, the second element of vector A with the second element of vector B, etc. In one or more embodiments, if A and B are strings, the binary values of the strings may be compared.

The computing system in FIG. 16.1 may implement and/or be connected to a data repository. For example, one type of data repository is a database. A database is a collection of information configured for ease of data retrieval, modification, re-organization, and deletion. Database Management System (DBMS) is a software application that provides an interface for users to define, create, query, update, or administer databases.

The user, or software application, may submit a statement or query into the DBMS. Then the DBMS interprets the statement. The statement may be a select statement to request information, update statement, create statement, delete statement, etc. Moreover, the statement may include parameters that specify data, or data container (database, table, record, column, view, etc.), identifier(s), conditions (comparison operators), functions (e.g. join, full join, count, average, etc.), sort (e.g. ascending, descending), or others. The DBMS may execute the statement. For example, the DBMS may access a memory buffer, a reference or index a file for read, write, deletion, or any combination thereof, for responding to the statement. The DBMS may load the data from persistent or non-persistent storage and perform computations to respond to the query. The DBMS may return the result(s) to the user or software application.

The computing system of FIG. 16.1 may include functionality to present raw and/or processed data, such as results of comparisons and other processing. For example, presenting data may be accomplished through various presenting methods. Specifically, data may be presented through a user interface provided by a computing device. The user interface may include a GUI that displays information on a display device, such as a computer monitor or a touchscreen on a handheld computer device. The GUI may include various GUI widgets that organize what data is shown as well as how data is presented to a user. Furthermore, the GUI may present data directly to the user, e.g., data presented as actual data values through text, or rendered by the computing device into a visual representation of the data, such as through visualizing a data model.

For example, a GUI may first obtain a notification from a software application requesting that a particular data object be presented within the GUI. Next, the GUI may determine a data object type associated with the particular data object, e.g., by obtaining data from a data attribute within the data object that identifies the data object type. Then, the GUI may determine any rules designated for displaying that data object type, e.g., rules specified by a software framework for a data object class or according to any local parameters defined by the GUI for presenting that data object type. Finally, the GUI may obtain data values from the particular data object and render a visual representation of the data values within a display device according to the designated rules for that data object type.

Data may also be presented through various audio methods. In particular, data may be rendered into an audio format and presented as sound through one or more speakers operably connected to a computing device.

Data may also be presented to a user through haptic methods. For example, haptic methods may include vibrations or other physical signals generated by the computing system. For example, data may be presented to a user using a vibration generated by a handheld computer device with a predefined duration and intensity of the vibration to communicate the data.

The above description of functions present a few examples of functions performed by the computing system of FIG. 16.1 and the nodes and/or client device in FIG. 16.2. Other functions may be performed using one or more embodiments.

While the above has been described with respect to a limited number of embodiments, those skilled in the art, having benefit of this disclosure, will appreciate that other embodiments can be devised which do not depart from the scope as disclosed herein. Accordingly, the scope should be limited by the attached claims.

What is claimed is:

1. A method for simulating fluid flow in a fractured reservoir comprising:
   generating a hybrid grid model (HG model) by generating a grid for a fractured reservoir model comprising a fracture and a matrix to obtain a generated grid;
   modifying the hybrid grid model to generate a hybrid grid cross flow equilibrium model (HG-CFE model), wherein modifying comprises:
     selecting a volume expansion parameter for a plurality of cross flow equilibrium elements, wherein the volume expansion parameter comprises an amount the fracture is expanded to include surrounding matrix elements of the matrix;
     generating the plurality of cross flow equilibrium elements based on the generated grid and the volume expansion parameter, the plurality of cross flow equilibrium elements comprising a plurality of physical properties,
       wherein generating the plurality of cross flow equilibrium elements further comprises combining a portion of the fracture with a fraction of neighboring matrix blocks on either side of the fracture, within a volume defined by the volume expansion parameter, into larger cross flow equilibrium elements, and
       wherein the plurality of cross flow equilibrium elements comprise the larger cross flow equilibrium elements;
     executing a sensitivity analysis with respect to a volume of the plurality of cross flow equilibrium elements without re-gridding the fractured reservoir model by integrating flow equations in cross-flow equilibrium elements, of the plurality of cross flow equilibrium elements, related to fracture-fracture flow;
     correcting inaccuracies by calibrating fluid saturations in the fracture by scaling a relative permeability in the fracture according to an oil saturation scaling factor; and
     calculating, using the plurality of cross flow equilibrium elements, a plurality of pore volume and transmissibility multipliers;
   simulating, using the HG-CFE model, a fluid flow in the fractured reservoir model by using the plurality of pore volume and transmissibility multipliers and a fracture relative permeability curve to obtain a result, wherein the fluid flow is calculated for the plurality of cross flow equilibrium elements; and
   presenting the result.

2. The method of claim 1, wherein the plurality of physical properties comprises a plurality of matrix and fracture properties of the fractured reservoir.

3. The method of claim 1, wherein generating the grid comprises using at least one selected from a group consisting of a one dimensional fracture in a two dimensional fractured reservoir and a two dimensional fracture in a three dimensional fractured reservoir.

4. The method of claim 1, wherein the volume expansion parameter is calculated as a ratio of a selected fracture aperture to a cross flow equilibrium expanded fracture.

5. The method of claim 1, further comprising:
   selecting the plurality of physical properties for cross flow equilibrium elements from a group consisting of volume, porosity, permeability, net-to-gross, and transmissibility.

6. The method of claim 1, further comprising:
calculating a fracture to fracture transmissibility using a star-delta approach.

7. The method of claim 1, further comprising:
calculating the fluid flow from the matrix to the fracture using the fracture relative permeability curve.

8. The method of claim 1, further comprising:
scaling a relative permeability in the fracture with oil saturation.

9. The method of claim 1,
wherein executing the sensitivity analysis uses a fracture relative permeability curve.

10. A system comprising:
one or more processors;
a memory;
instructions stored in the memory and executable by at least one of the one or more processors to cause the system to:
generate a hybrid grid model (HG model) by generating a grid for a fractured reservoir model comprising a fracture and a matrix to obtain a generated grid;
modify the hybrid grid model to generate a hybrid grid cross flow equilibrium model (HG-CFE model), wherein modifying comprises:
selecting a volume expansion parameter for a plurality of cross flow equilibrium elements, wherein the volume expansion parameter comprises an amount the fracture is expanded to include surrounding matrix elements of the matrix;
generating the plurality of cross flow equilibrium elements based on the generated grid and the volume expansion parameter, the plurality of cross flow equilibrium elements comprising a plurality of physical properties,
wherein generating the plurality of cross flow equilibrium elements further comprises combining a portion of the fracture with a fraction of neighboring matrix blocks on either side of the fracture, within a volume defined by the volume expansion parameter, into larger cross flow equilibrium elements, and
wherein the plurality of cross flow equilibrium elements comprise the larger cross flow equilibrium elements; and
executing a sensitivity analysis with respect to a volume of the plurality of cross flow equilibrium elements without re-gridding the fractured reservoir model by integrating flow equations in cross-flow equilibrium elements, of the plurality of cross flow equilibrium elements, related to fracture-fracture flow;
correcting inaccuracies by calibrating fluid saturations in the fracture by scaling a relative permeability in the fracture according to an oil saturation scaling factor; and
calculating, using the plurality of cross flow equilibrium elements, a plurality of pore volume and transmissibility multipliers;
simulate, using the HG-CFE model, a fluid flow in the fractured reservoir model by using the plurality of pore volume and transmissibility multipliers and a fracture relative permeability curve to obtain a result, wherein the fluid flow is calculated for the plurality of cross flow equilibrium elements; and
present the result.

11. The system of claim 10, wherein generating the grid comprises using at least one selected from a group consisting of a one dimensional fracture in a two dimensional fractured reservoir and a two dimensional fracture in a three dimensional fractured reservoir.

12. The system of claim 10, wherein the volume expansion parameter is calculated as a ratio of a selected fracture aperture to a cross flow equilibrium expanded fracture.

13. The system of claim 10, wherein the instructions further cause the system to:
select the plurality of physical properties for cross flow equilibrium elements from a group consisting of volume, porosity, permeability, net-to-gross, and transmissibility.

14. The system of claim 10, wherein the instructions further cause the system to:
calculate a fracture to fracture transmissibility using a star-delta approach.

15. The system of claim 10, wherein the instructions further cause the system to:
calculate the fluid flow from the matrix to the fracture using the fracture relative permeability curve.

16. The system of claim 10, wherein the instructions further cause the system to:
scale a relative permeability in the fracture with oil saturation.

17. A computer program product comprising computer readable program code for causing a computing system to perform operations, the operations comprising:
generating a hybrid grid model (HG model) by generating a grid for a fractured reservoir model comprising a fracture and a matrix to obtain a generated grid;
modifying the hybrid grid model to generate a hybrid grid cross flow equilibrium model (HG-CFE model), wherein modifying comprises:
selecting a volume expansion parameter for a plurality of cross flow equilibrium elements, wherein the volume expansion parameter comprises an amount the fracture is expanded to include surrounding matrix elements of the matrix;
generating the plurality of cross flow equilibrium elements based on the generated grid and the volume expansion parameter, the plurality of cross flow equilibrium elements comprising a plurality of physical properties,
wherein generating the plurality of cross flow equilibrium elements further comprises combining a portion of the fracture with a fraction of neighboring matrix blocks on either side of the fracture, within a volume defined by the volume expansion parameter, into larger cross flow equilibrium elements, and
wherein the plurality of cross flow equilibrium elements comprise the larger cross flow equilibrium elements; and
executing a sensitivity analysis with respect to a volume of the plurality of cross flow equilibrium elements without re-gridding the fractured reservoir model by integrating flow equations in cross-flow equilibrium elements, of the plurality of cross flow equilibrium elements, related to fracture-fracture flow;
correcting inaccuracies by calibrating fluid saturations in the fracture by scaling a relative permeability in the fracture according to an oil saturation scaling factor; and
calculating, using the plurality of cross flow equilibrium elements, a plurality of pore volume and transmissibility multipliers;

simulating, using the HG-CFE model, a fluid flow in the fractured reservoir model by using the plurality of pore volume and transmissibility multipliers and a fracture relative permeability curve to obtain a result, wherein the fluid flow is calculated for the plurality of cross flow equilibrium elements; and presenting the result.

18. The computer program product of claim 17, wherein the plurality of physical properties comprises a plurality of matrix and fracture properties of the fractured reservoir model.

19. The computer program product of claim 17, wherein generating the grid comprises using at least one selected from a group consisting of a one dimensional fracture in a two dimensional fractured reservoir and a two dimensional fracture in a three dimensional fractured reservoir.

20. The computer program product of claim 17, wherein the volume expansion parameter is calculated as a ratio of a selected fracture aperture to a cross flow equilibrium expanded fracture.

* * * * *